US008921879B2

(12) United States Patent
Nam et al.

(10) Patent No.: US 8,921,879 B2
(45) Date of Patent: Dec. 30, 2014

(54) OPTICAL DEVICE AND METHOD FOR MANUFACTURING SAME

(75) Inventors: Ki Myung Nam, Cheonan-si (KR); Tae-Hwan Song, Hwaseong-si (KR); Young-Chul Jun, Ansan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 13/583,559

(22) PCT Filed: Mar. 30, 2011

(86) PCT No.: PCT/KR2011/002177
§ 371 (c)(1),
(2), (4) Date: Sep. 7, 2012

(87) PCT Pub. No.: WO2011/122846
PCT Pub. Date: Oct. 6, 2011

(65) Prior Publication Data
US 2013/0037833 A1     Feb. 14, 2013

(30) Foreign Application Priority Data

Mar. 31, 2010  (KR) .................. 10-2010-0029460

(51) Int. Cl.
*H01L 33/00*     (2010.01)
*H05K 1/05*      (2006.01)
*H01L 25/075*    (2006.01)
*H01L 33/62*     (2010.01)

(52) U.S. Cl.
CPC .............. *H05K 1/05* (2013.01); *H01L 25/0753* (2013.01); *H01L 33/62* (2013.01); *H01L 2933/0033* (2013.01); *H01L 2224/32225* (2013.01); *H01L 2224/48227* (2013.01); *H01L 2224/73265* (2013.01); *H01L 2924/01322* (2013.01)

USPC ................. 257/98; 257/81; 257/88; 257/93; 257/99

(58) Field of Classification Search
USPC ..................... 257/93, 88, 81, 98, 99
See application file for complete search history.

(56) References Cited

U.S. PATENT DOCUMENTS

| 7,015,654 B1* | 3/2006 | Kuhlmann et al. ............ 315/291 |
| 8,154,031 B2 | 4/2012 | Grotsch et al. .................. 257/88 |
| 2003/0193088 A1 | 10/2003 | Hall ............................... 257/713 |
| 2008/0179602 A1 | 7/2008 | Negley et al. ................... 257/88 |

(Continued)

FOREIGN PATENT DOCUMENTS

| JP | 2000-236116 | 8/2000 | ............ H01L 33/00 |
| JP | 2000236116 A * | 8/2000 | |

(Continued)

*Primary Examiner* — Kyoung Lee
*Assistant Examiner* — Ratisha Mehta
(74) *Attorney, Agent, or Firm* — Sunstein Kann Murphy & Timbers LLP

(57) ABSTRACT

The present invention relates to an optical device and a method for manufacturing the same. The technical object of the invention is to realize a surface emitting body which allows heat generated from a light-emitting chip to be easily dissipated, eliminates the need for an additional wiring layer, and allows a singular light emitting chips or a plurality of light emitting chips to be arranged in series, in parallel, or in series-parallel. The present invention discloses an optical device comprising: a substrate; a plurality of light emitting chips disposed on the substrate; a plurality of conductive wires which electrically connect the substrate with the light emitting chips such that the plurality of light emitting chips are connected to each other in series, in parallel or in series-parallel; and a protective layer which covers the plurality of light emitting chips and the plurality of conductive wires on the substrate.

23 Claims, 30 Drawing Sheets

(56) References Cited

U.S. PATENT DOCUMENTS

| | | | |
|---|---|---|---|
| 2009/0230525 A1* | 9/2009 | Chang Chien et al. | 257/676 |
| 2010/0157583 A1* | 6/2010 | Nakajima | 362/184 |
| 2010/0207142 A1* | 8/2010 | Chen et al. | 257/98 |

FOREIGN PATENT DOCUMENTS

| | | | | |
|---|---|---|---|---|
| JP | 2003-309292 | | 10/2003 | ............. H01L 33/00 |
| KR | 1020050014769 A | | 2/2005 | ............. H01L 33/00 |
| KR | 100759016 B1 | | 9/2007 | ............. H01L 33/00 |
| KR | 1020070106624 | | 11/2007 | ............. H01L 33/00 |
| KR | 1020090119862 A | | 11/2009 | ............. H01L 33/00 |
| KR | 1020100016737 | | 2/2010 | ............. H01L 33/48 |
| WO | WO 2006/028312 A1 | | 3/2006 | ............. H01L 33/00 |
| WO | WO 2008/091837 A2 | | 7/2008 | ............. H01L 27/15 |

\* cited by examiner

OPTICAL DEVICE AND METHOD FOR MANUFACTURING SAME

CROSS REFERENCE

This application is a §371 application of International Patent Application PCT/KR2011/002177 filed Mar. 30, 2011, which claims priority to Korean Application No. 10-2010-0029460 filed Mar. 31, 2010, the contents of which are incorporated herein by reference.

TECHNICAL FIELD

The present invention relates to optical devices and a method of manufacturing the optical device.

BACKGROUND ART

An optical device generally refers to an element which generates light in response to an electrical signal applied thereto. Such optical devices are being used in a variety of areas. Among these areas, the area of display is gradually being developed, and thus research into optical devices is vigorous and ongoing.

Among optical devices, a light emitting chip (light emitting diode (LED)) has higher efficiency and emits light of a higher brightness compared to existing optical devices and so is responsible for having caused a rapid increase in the usage of the light emitting chip.

The light emitting chip generates light by virtue of binding a hole with an electron, and also generates heat in addition to the light at the time of the binding. Here, if heat from the light emitting chip is not dissipated, this may create the risk of the device breaking and degradation in operating efficiency.

In addition, if there is a short circuit in an electrode when the light emitting chip is packaged to form a device, the light emitting chip will be broken, thus decreasing the reliability. Accordingly, there is a need to configure a device which can assure easy dissipation of heat from the light emitting chip and prevent a short circuit between electrodes.

DISCLOSURE

Technical Problem

The technical object of the invention is to provide an optical device embodying a surface emitting body and a method of manufacturing the optical device, which allows heat generated from a light-emitting chip to be easily dissipated, eliminates the need for an additional wiring layer, and allows a single or a plurality of light emitting chips to be arranged in series, in parallel, or in series-parallel.

Technical Solution

An optical device according to the present invention includes: a substrate; a plurality of light emitting chips disposed on the substrate; a plurality of conductive wires which electrically connect the substrate with the light emitting chips such that the plurality of light emitting chips are connected to each other in series, in parallel or in series-parallel; and a protective layer which covers the plurality of light emitting chips and the plurality of conductive wires on the substrate.

The substrate includes: a plurality of conductive bulks which are arranged in at least one row direction and at least one column direction; a penetrating insulation member disposed between the plurality of conductive bulks; and at least one conductive layer formed on upper surfaces of the plurality of conductive bulks.

The plurality of light emitting chips are attached to the at least one conductive layer by means of a conductive adhesive and connected to another adjacent conductive layer by means of the conductive wires.

The penetrating insulation member further includes insulative fixing members disposed on the top and the bottom thereof and covering the plurality of conductive bulks.

The optical device further includes terminal layers formed on upper, lower or lateral surface of at least one of the plurality of conductive bulks.

The optical device further includes an insulation layer or a radiation plate disposed on a lower surface of at least one of the plurality of conductive bulks.

The plurality of conductive bulks include a plurality of protrusions formed on upper surfaces thereof.

The number of the conductive bulks in a row direction and the number of the conductive bulks in a column direction are the same or different from each other.

The plurality of light emitting chips are arranged in at least one row direction and at least one column direction, and the number of the light emitting chips in a row direction and the number of the light emitting chips in a column direction are the same as or different from each other.

The optical device further includes a barrier formed on the substrate such that the barrier surrounds the protective layer.

The barrier has a rectangular or circular shape when viewed in a plan.

The protective layer has a convex lens shape which is convex when viewed in cross-section.

The substrate includes: a plurality of conductive bulks; a plurality of penetrating insulation members disposed between the plurality of conductive bulks; an insulation layer formed on an upper surface of at least one of the plurality of conductive bulks; and a conductive layer formed on an upper surface of at least one of the plurality of conductive bulks.

The plurality of light emitting chips are attached to the insulation layer, the light emitting chips are connected to each other by means of the conductive wires and the light emitting chips and the conductive layer are connected to each other by means of the conductive wires.

The substrate includes: a conductive bulk; an insulation layer formed on an upper surface of the conductive bulk; a plurality of electrode layers formed on a surface of the insulation layer; and a plurality of terminal layers formed on a surface of the insulation layer.

The plurality of light emitting chips are attached to the electrode layers by means of a conductive adhesive, and the plurality of conductive wires connect the light emitting chips to the electrode layers, the light emitting chips to the terminal layers, and the electrode layers to the light emitting chips.

An optical device according to the present invention includes: a substrate comprising a first conductive bulk having a disk shape, a second conductive bulk having an annular disk shape and surrounding the first conductive bulk and a penetrating insulation member disposed between the first conductive bulk and the second conductive bulk; a plurality of light emitting chips arranged on the first and second conductive bulks of the substrate; a plurality of conductive wires for connecting the plurality of light emitting chips to the first or second conductive bulk of the substrate; and a protective layer covering the plurality of light emitting chips and the conductive wires on the substrate.

The optical device further includes a conductive layer formed on upper surfaces of the first and second conductive bulks, and a terminal layer formed on lower surfaces of the first and second conductive bulks.

A method of manufacturing an optical device, according to the present invention includes: forming pattern layers covering upper and lower surfaces of a metal plate; anodizing a region of the metal plate which is exposed through the pattern layer, thus providing a penetrating insulation member passing through the metal plate and a substrate containing a plurality of regions separated by the penetrating insulation member; removing the pattern layer to expose the substrate; filling pores of the penetrating insulation member or sealing orifices of the pores; attaching light emitting chips to the plurality of separated regions of the substrate, respectively; bonding the light emitting chips to at least one of the plurality of regions of the substrate by means of conductive wires such that the light emitting chips are connected to each other in series, in parallel or in series-parallel; and forming a protective layer on the substrate to cover the light emitting chips and the conductive wires.

Anodizing the region of the metal plate is performed such that the plurality of separated regions have the same surface area or different surface areas.

A method of manufacturing an optical device, according to the present invention includes: preparing a plurality of metal plates; forming adhesive insulation members on boundary surfaces of the metal plates; laminating the plurality metal plates with the adhesive insulation members disposed between the metal plates; partially cutting the metal plates in a direction perpendicular to the boundary surfaces and then completely cutting the metal plates, thus providing a substrate containing a plurality of regions electrically isolated by the adhesive insulation members; attaching a plurality of light emitting chips on the plurality of separated regions of the substrate, respectively; bonding the plurality of light emitting chips to at least one of the plurality of regions of the substrate using conductive wires such that the plurality of light emitting chips are connected to each other in series, in parallel or in series-parallel; and forming a protective layer on the substrate to cover the light emitting chips and the conductive wires.

Partially and completely cutting the metal plates are performed such that the plurality of separated regions have the same surface area or different surface areas.

Partially cutting the metal plates is performed in such a way as to form a slit in the metal plates such that the plurality of regions of the substrate are separated from each other and to fill the slit with an adhesive insulation member.

Advantageous Effects

The optical device and method of manufacturing the optical device according to the present invention uses aluminum or aluminum alloy as a substrate, thus allowing heat generated from a light emitting chip to be rapidly dissipated outside through the substrate.

Furthermore, since the optical device and method of manufacturing the optical device according to the present invention use aluminum or aluminum alloy serving as wiring layers, there is no need to form additional complicated wiring layers.

In addition, since the optical device and method of manufacturing the optical device according to the present invention separates a substrate using a plurality of insulation layers, a plurality of light emitting chips can be connected to each other in series, in parallel or in series-parallel, thus realizing a surface emitter without difficulty.

BEST MODE

Preferred embodiments of the present invention will be described in detail with reference to the accompanying drawings so as to allow the invention to be easily implemented by those skilled in the art to which the invention pertains.

Figure 1A:
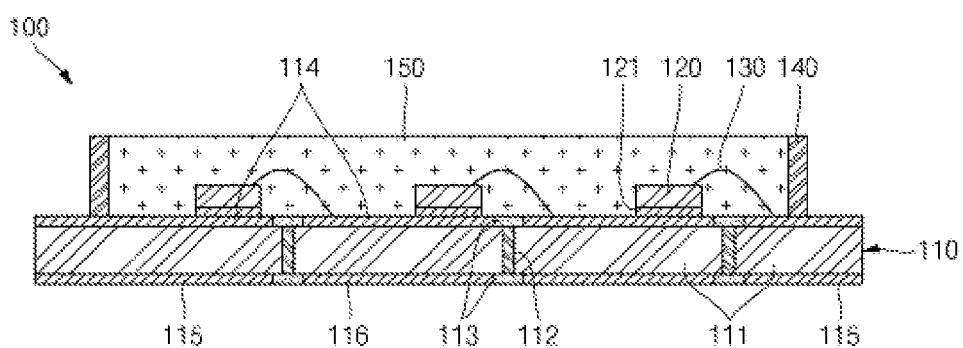
FIGS. 1a to 1c are a cross-sectional view, a plan view and an equivalent circuit schematic, respectively, which show an optical device according to an embodiment of the present invention.
Figure 1B:
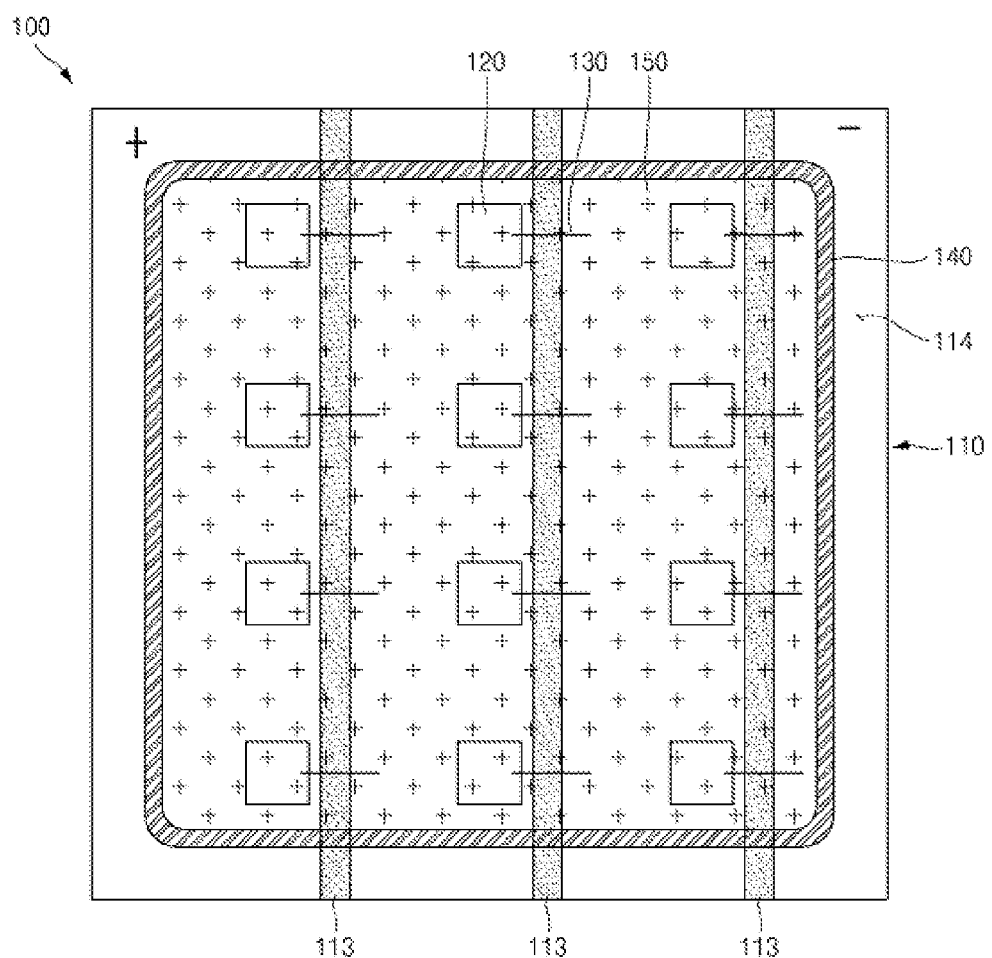
Figure 1C:
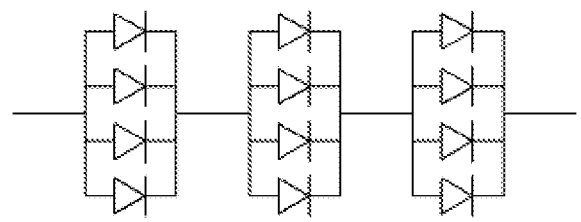

FIGS. 1a to 1c are a cross-sectional view, a plan view and an equivalent circuit schematic, respectively, which show an optical device according to an embodiment of the present invention.

As showing in FIGS. 1a to 1c, the optical device 100 according to the embodiment of the present invention comprises a substrate 110, a plurality of light emitting chips 120, a plurality of conductive wires 130, a barrier 140 and a protective layer 150.

The substrate 110 is configured to have an approximately flat shape, which includes a plurality of conductive bulks 111, a plurality of penetrating insulation members 112, a plurality of insulative fixing members 113, a plurality of conductive layers 114, a plurality of terminal layers 115 and a plurality of insulation layers 116.

The plurality of conductive bulks 111 are arranged in at least one row as well as in at least one column. In an example, the plurality of conductive bulks 111 may be composed of one row of bulks and three columns of bulks, but the present invention is not intended to be limited to this arrangement. The conductive bulks 111 may be made of metal plates which have excellent electric conductivity and thermal conductivity. For instance, the conductive bulks 111 may be made of any one selected from among aluminum, aluminum alloy, copper, copper alloy, iron, iron alloy and its equivalents, but the present invention is not intended to be limited to these. As a result, the conductive bulks 111 are capable of not only allowing electric signals to be easily transmitted to the light emitting chips 120 but also to allow heat generated from the light emitting chips 120 to be easily and rapidly dissipated.

The plurality of penetrating insulation members 112 are interposed between the plurality of conductive bulks 111 so as to interconnect the plurality of conductive bulks 111 to form a single substrate 110. Since a width of each penetrating insulation member 112 is very small compared to that of each of the conductive bulks 111, the majority of the substrate 110 is composed of the conductive bulks 111. Consequently, the radiation performance of the optical device 100 according to the present invention is further improved. The penetrating insulation members 112 may be formed by anodization of the conductive bulks 111 or may be usual adhesive insulation members, but the present invention is not intended to limit the material of the penetrating insulation members 112.

The plurality of insulative fixing members 113 may be provided at both the tops and the bottoms of the penetrating insulation members 112. Furthermore, the insulative fixing members 113 may occupy partial areas of the upper and lower surfaces of the conductive bulks 111 which are positioned at peripheries of the top and the bottom of the penetrating insulation members 112. The insulative fixing members 113 function not only to protect the penetrating insulation members 112, which are relatively soft, but also to prevent the substrate 110, which is composed of the plurality of conductive bulks 111, from warping. The insulative fixing members 113 may be made of, for example, any one from among polyphthalamide (PPA), epoxy resin, photosensitive paste, equivalents and mixtures thereof, but the present invention is not intended to limit the material used to make the insulative fixing members 113.

The plurality of conductive layers 114 is formed on the upper surfaces of the conductive bulks 111. The conductive layers 114 serve as areas to which the light emitting chips 120 are substantially attached using adhesive 121 or to which the conductive wires 130 are substantially bonded. Furthermore, the conductive layers 114 also serve as areas which reflect light generated from the light emitting chips 120. To this end, the conductive layers 114 may be made of at least one selected from among gold (Au), silver (Ag), copper (Cu), aluminum (Al), nickel (Ni), tungsten (W), palladium (Pd) and equivalents, which are excellent in electric conductivity and light reflectivity, or alloys thereof. Preferably, the conductive layers 114 may be made of silver (Ag) which has excellent electric conductivity and light reflectivity.

The plurality of terminal layers 115 are formed on lower surfaces of the conductive bulks 111. For instance, referring to FIG. 1a, the terminal layers 115 may be formed on a lower surface of the leftmost conductive bulk 111 and a lower surface of the rightmost conductive bulk 111. The terminal layers 115 offer areas which enable the optical device 100 according to the present invention to be mounted on external devices (for example, motherboards, main boards and so on). To this end, the terminal layers 115 may be made of at least one selected from copper (Cu), nickel/gold (Ni/Au), nickel/palladium/gold (Ni/Pd/Au), silver (Ag) and equivalents, or alloys thereof. Although not shown in the drawings, the terminal layers 115 may be conductive terminals which are electrically attached to the conductive bulks 111 using screws or tape.

The plurality of insulation layers 116 are formed on the lower surfaces of the conductive bulks 111. Referring to FIG. 1a, the insulation layers 116 may be formed, for example, on the lower surfaces of two conductive bulks 111 which are positioned nearest to the center. The insulation layers 116 function to prevent the lower surfaces of the conductive bulks 111 from being exposed, thus avoiding the creation of an undesired electric short. To this end, the insulation layers 116 may be made of any one selected from among a common insulative sheet, polyimide, PBO (polybenzoxazole) and equivalents, but the present invention is not intended to limit the material of the insulation layers 116. Furthermore, in order to further improve radiation performance, the present invention may be configured such that radiating plates, radiating pads or radiating fins are directly attached to the lower surfaces of the conductive bulks 111, instead of the insulation layers 116. In this respect, additional solders, solder bumps or solder balls may be attached to the terminal layers 115 so as to attain a predetermined thickness.

The plurality of light emitting chips 120 are attached to the upper surface of at least one conductive bulk 111 of the substrate 110. In other words, the light emitting chips 120 are adhesively attached to the conductive layers 114 formed on the conductive bulk 111, by means of conductive adhesive 121. Referring to FIG. 1b, the conductive layer 114 formed on the upper surface of the first conductive bulk 111, viewed from the left, may be provided with, for example, four light emitting chips 120 adhesively attached thereto. The conductive layer 114 formed on the upper surface of the second conductive bulk 111, viewed from the left, is provided with four light emitting chips 120 adhesively attached thereto. The conductive layer 114 formed on the upper surface of the third conductive bulk 111, viewed from the left, is provided with four light emitting chips 120 adhesively attached thereto. At the same time, there is no light emitting chip 120 adhesively attached to the upper surface of the fourth conductive bulk 111. The conductive adhesive 121 may be made of any one selected from eutectic solder (Sn37Pb), high lead solder (Sn95Pb) and lead-free solder (SnAg, SnAu, SnCu, SnZn, SnZnBi, SnAgCu, SnAgBi etc.), but the present invention is not intended to limit the material of the conductive adhesive 121. Although a light emitting chip array having a 4×3 arrangement of light emitting chips is illustrated in FIG. 1b, the present invention is also not limited to the array. Specifically, the numbers of the light emitting chips 120 placed in a row and in a column may be identical to or different from each other, and locations of the light emitting chips 120 may be varied in various combinations. Furthermore, the light emitting chips 120 may be a common light emitting diode (LED), but the present invention is not intended to limit the kind of the light emitting chip 120.

The plurality of conductive wires 130 electrically connect the conductive bulks 111 adjacent to the light emitting chips 120 to each other. Specifically, the conductive wires 130 may be bonded at one end to the light emitting chips 120 by means of ball bonding technology and may be bonded at the other end to the conductive layer 114 by means of stitch bonding technology, and vice versa. Consequently, one of the conductive bulks 111 is electrically connected to the adjacent conductive bulk 111 via the light emitting chips 120 and the conductive wires 130. In an example, referring to FIG. 1b, the conductive wires 130 electrically connect the light emitting chips 120 of the first column to the conductive layer 114 of the second column. Furthermore, the conductive wires 130 electrically connect the light emitting chips 120 of the second column to the conductive layer 114 of the third column. Likewise, the conductive wires 130 electrically connect the light emitting chips 120 of the third column to the conductive layer 114 of the fourth column. With the connecting configuration of the substrate 110 and the conductive wires 130, the optical device 100 according to an embodiment of the present invention is constructed such that about four light emitting chips are connected to each other in parallel and three columns of light emitting chips, each column having four light emitting chips, are connected to each other in series, as illustrated in FIG. 1c.

The barrier 140 is formed on the substrate 110 to have a predetermined thickness. The barrier 140 functions to define a region of the protective layer 150, which will be described later. Referring to FIG. 1b, the barrier 140 is configured in the form of an approximate square line, but the present is not intended to be limited to the shape of the barrier 140. The barrier 140 may be made of epoxy resin, photosensitive barrier rib paste (PSR) or mixtures thereof, and may be made of silicone in some cases. However, the present invention is not intended to limit the material of the barrier 140.

The protective layer 150 covers all of the plurality of light emitting chips 120 and the plurality of conductive wires 130 on the substrate 110. Consequently, the protective layer 150 protects the plurality of light emitting chips 120 and the plurality of conductive wires 130 on the substrate 110 from the external electric, physical, mechanical and chemical environments. It goes without saying that the horizontal width of the protective layer 150 is restricted by the barrier 140. The protective layer 150 may be prepared by mixing epoxy resin with conventional florescent material. The florescent material is excited by application of visible light or ultraviolet rays generated from the light emitting chips 120, and subsequently generates visible light way as it stabilizes. Accordingly, the protective layer 150, which is made of florescent material, may convert the light generated from the light emitting chips 120 into red, green and blue (RGB) lights. Accordingly, the optical device 100 according to an embodiment of the present invention may be used as a back light unit (BLU) of a liquid crystal display panel. In other words, the optical device 100 according to an embodiment of the present invention may be used as a surface emitting device.

Figure 2:
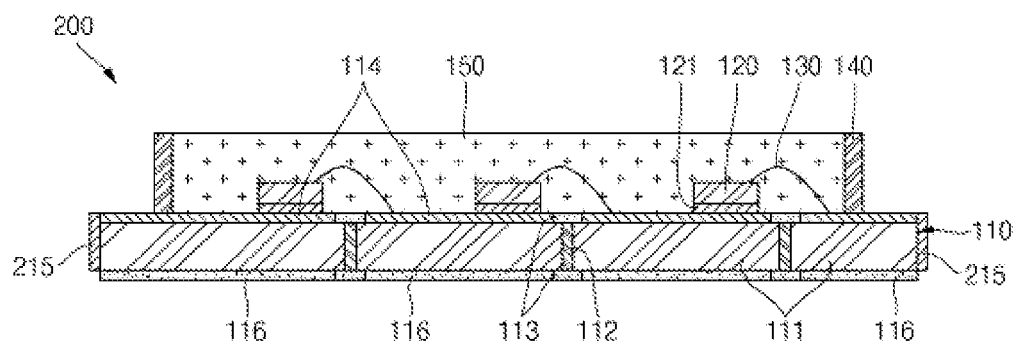
FIG. 2 is a cross-sectional view showing an optical device according to another embodiment of the present invention.

FIG. 2 is a cross-sectional view showing an optical device according to another embodiment of the present invention.

As shown in FIG. 2, the optical device 200 according to another embodiment of the present invention is almost identical to the optical device that has been previously described. Therefore, only the difference between this optical device and the previous optical device will be described.

As shown in FIG. 2, the optical device 200 according to the present invention has terminal layers 215 which may be formed on lateral surfaces of conductive bulks 111. It goes without saying that insulation layers 116 are formed on lower surfaces of all the conductive bulks 111 to avoid the creation of an undesired electric short. With this configuration, the optical device according to another embodiment of the present invention enables electric signals to be applied laterally. Although not shown in the drawings, the terminal layers 115 may also be formed on an upper surface of the leftmost conductive bulk 111 and an upper surface of the rightmost conductive bulk 111. With this configuration, the optical device 200 according to another embodiment of the present invention enables various mount structures to be achieved. In other words, positions of the terminal layers 215 may be changed depending on the configuration or design of external devices, thus allowing the optical device 200 to be easily mounted.

Figure 3A:
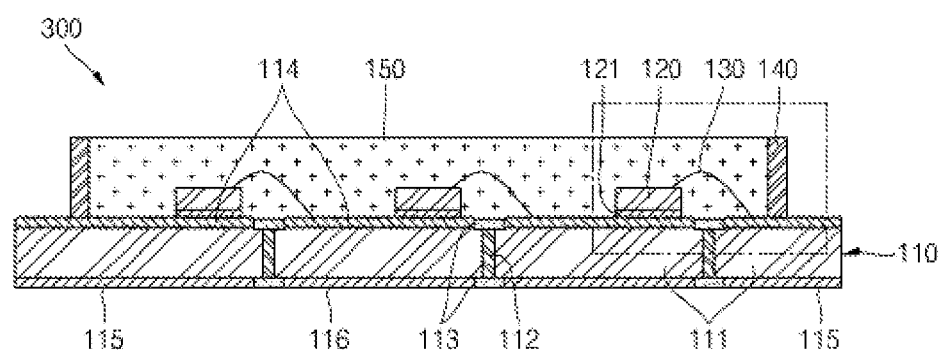
FIGS. 3a and 3b are a cross-sectional view and a fragmentary enlarged view showing an optical device according to a further embodiment of the present invention.
Figure 3B:
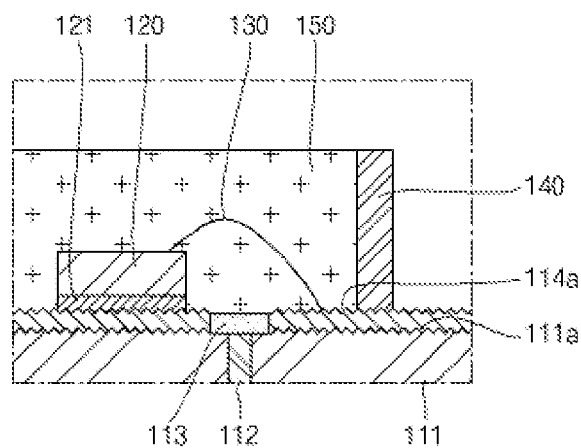

FIGS. 3a and 3b are a cross-sectional view and a fragmentary enlarged view showing an optical device according to a further embodiment of the present invention.

As shown in FIGS. 3a and 3b, the optical device 300 according to the further embodiment of the present invention may be configured such that upper surfaces of a plurality of conductive bulks 111 are provided with a plurality of fine protrusions or textured portions 111a. In other words, a surface roughness of the conductive bulks 111 is relatively high. The fine protrusions or textured portions 111a may be embodied using conventional sand blasting or chemical etching technology. By the formation of the fine protrusions or textured portions 111a on the conductive bulks 111, the surfaces of the conductive layers 114, which is formed on the fine uneven or textured portions 111a, are correspondingly provided with a plurality of fine protrusions or textured portions 114a. The protrusions or textured portions increase the bonding area of the conductive adhesive 121 to which a light emitting chips 120 are adhesively attached, thus increasing the adhesive strength of attachment of the light emitting chips 120. In addition, the protrusions or textured portions increase the bonding area of a barrier 140, thus increasing adhesive strength of the barrier 140. Furthermore, the protrusions or the textured portions increase adhesive strength between a protective layer 150 and the substrate 110, so that boundary separation caused by the difference in coefficient of thermal expansion between the substrate 110 and the protective layer 150 is suppressed. In addition, the protrusions or textured portions cause a diffuse reflection of light emitted from the light emitting chips 120, resulting in higher brightness and uniform roughness, thus providing a more excellent surface emitter.

Figure 4:
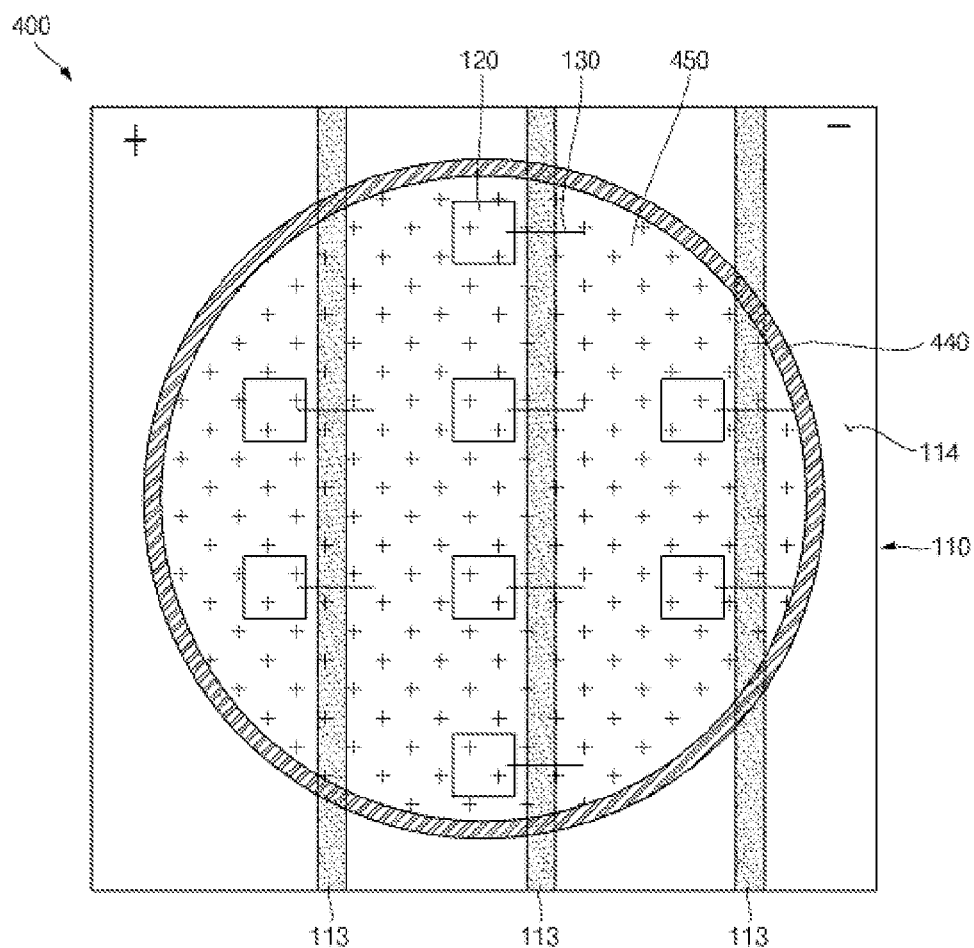
FIG. 4 is a plan view showing an optical device according to a still further embodiment of the present invention.

FIG. 4 is a plan view showing an optical device according to a still further embodiment of the present invention.

As shown in FIG. 4, the optical device 400 according to the still further embodiment of the present invention is different because the numbers of light emitting chips 120 in a row are different from each other and the numbers of light emitting chips 120 in a column are different from each other. For example, as shown in FIG. 4, an upper surface of the first left conductive bulk 111 is provided with two light emitting chips 120. An upper surface of the second conductive bulk 111 is provided with four light emitting chips 120. An upper surface of the third conductive bulk 111 is provided with two light emitting chips 120. At the same time, an upper surface of the fourth conductive bulk 111 is not provided with the light emitting chips 120. It goes without saying that the numbers of the light emitting chips 120 in the present invention are not restricted, and many different numbers of light emitting chips 120 may be provided.

In this embodiment, a barrier 440, which is formed on an upper surface of a substrate 110, may be configured to have an approximate annular shape, when viewed in a plan. Accordingly, protective layers 450 formed inside the barrier 440 are also configured to have an approximate annular shape. It goes without saying that the present invention is not intended to limit the shapes of the barrier 440 and the protective layers

450. In other words, the light emitting chips 120 may be varied in number and disposition according to the user's intention and the desired design. Designs of the barrier 440 and the protective layers 450 may also be variously varied.

Figure 5A:
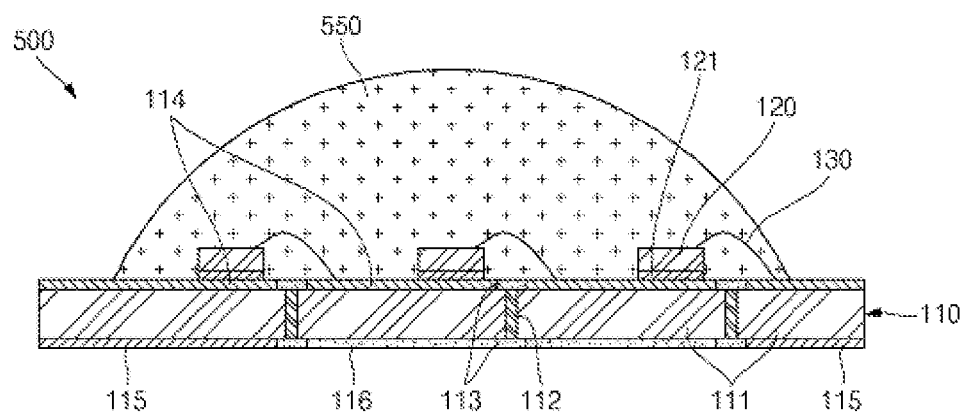
FIGS. 5a and 5b are cross-sectional views showing an optical device according to a still further embodiment of the present invention.
Figure 5B:
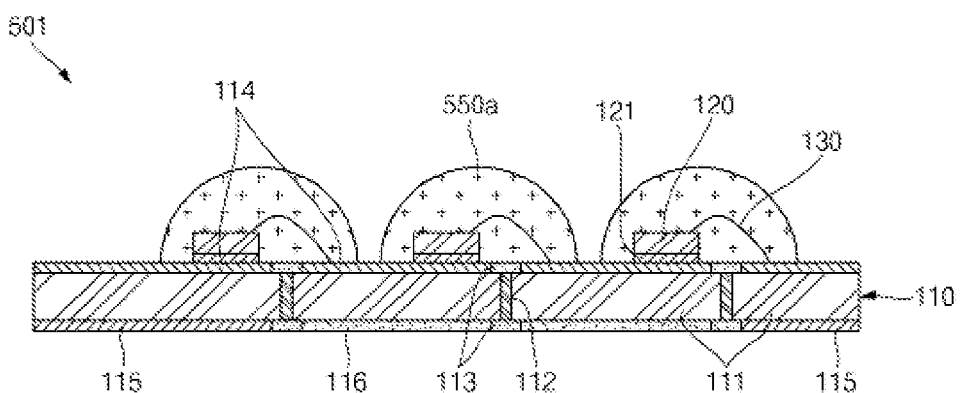

FIGS. 5a and 5b are cross-sectional views showing an optical device according to a still further embodiment of the present invention.

As shown in FIG. 5a, the optical device 500 according to the still further embodiment of the present invention may have no barrier. Instead, a protective layer 550, which covers a plurality of light emitting chips 120, may be configured to have a convex lens shape which is convex at an upper portion when viewed in cross-section. Consequently, the present invention enables a surface emitter having a focus to be embodied. On the other hand, the present invention may also offer a concave lens which is concave at an upper portion.

As shown in FIG. 5b, an optical device 500a according to a still further embodiment of the present invention may have a configuration in which respective protective layers 550a cover the corresponding light emitting chips 120. Furthermore, the protective layers 550a may be covered with dome type lenses 560. The dome type lenses 560 may be manufactured by a molding process, preferably through a molding process using a transparent or translucent encapsulant. Likewise, each of the lenses may also be configured to have a convex or concave lens shape which is convex or concave at the upper portion when viewed in cross-section. Since the optical device 500a is configured such that respective light emitting chips 120 are covered with the separate protective layers 550a and the dome type lenses 560, it may be cut into separate unit optical devices. Specifically, the substrate 110 is cut between the dome type lenses, resulting in separate unit light emitting devices. In this embodiment, the cutting process may include conventional cutting processes using any one selected from among a diamond blade, a laser beam, chemical etching and equivalents, and the present invention is not limited to these cutting processes.

Figure 6A:
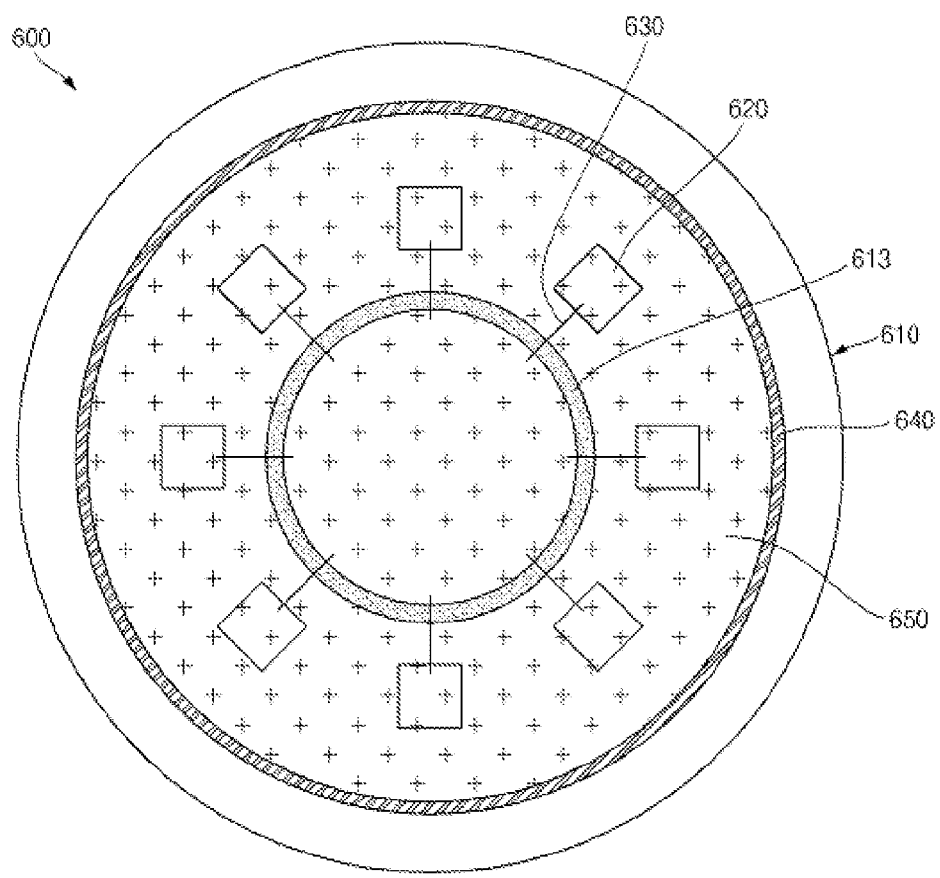
FIGS. 6a and 6b are a plan view and a cross-sectional view showing an optical device according to a still further embodiment of the present invention.
Figure 6B:
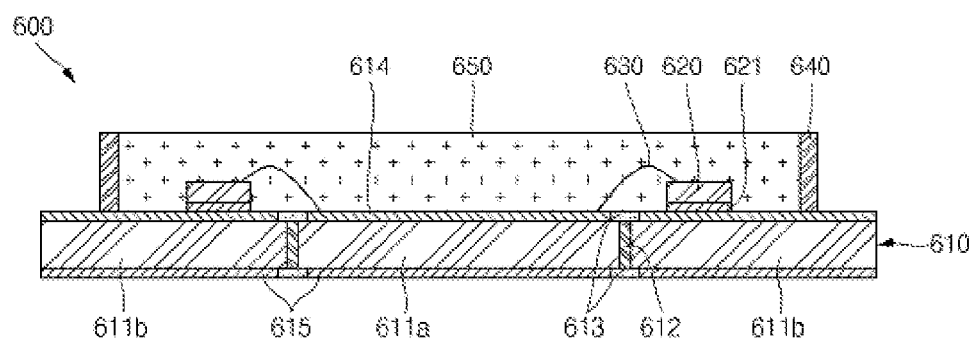

FIG. 6a is a plan view and FIG. 6b is a cross-sectional view showing an optical device according to a still further embodiment of the present invention.

As shown in FIGS. 6a and 5b, the optical device 600 according to the still further embodiment of the present invention comprises a substrate 610, a plurality of light emitting chips 620, a plurality of conductive wires 630, a barrier 640 and a protective layer 650.

The substrate 610 includes a first conductive bulk 611a, a second conductive bulk 611b, and a penetrating insulation member 612. The substrate 610 further includes insulative fixing members 613, conductive layers 614 and terminal layers 615.

The first conductive bulk 611a is configured to have an approximate disk shape. The second conductive bulk 611b is configured to have an approximate annular shape surrounding the first conductive bulk 611a.

The penetrating insulation member 612 is disposed between the first conductive bulk 611a and the second conductive bulk 611b.

The insulative fixing members 613 are formed on the top and the bottom of the penetrating insulation member 612, and cover partial region of upper and lower surfaces of the first and second conductive bulks 611a and 611b.

The conductive layers 614 are formed on upper surfaces of the first and second conductive bulk 611a and 611b, respectively.

The terminal layers 615 are formed on lower surfaces of the first and second conductive bulks 611a and 611b.

In this embodiment, since materials of the first and second conductive bulks 611a and 611b, the penetrating insulation member 612, the insulative fixing members 613, the conductive layers 614 and the terminal layers 615 have been described in previous embodiments, specific descriptions thereof will be omitted.

The plurality of light emitting chips 620 may be positioned at the first conductive bulk 611a or the second conductive bulk 611b. In an example, as shown in FIGS. 6a and 6b, the plurality of light emitting chips 620 may be adhesively attached to the conductive layers 614 in an approximate radial pattern via conductive adhesives 621.

The plurality of conductive wires 630 connect the plurality of light emitting chips 620 to the first conductive bulk 611a or the second conductive bulk 611b of the substrate 610. In an example, as shown in FIGS. 6a and 6b, the plurality of conductive wires 630 connect the light emitting chips 620 to the conductive layer 614 of the first conductive bulk 611a.

The barrier 640 may be formed on an upper surface of the second conductive bulk 611b of the substrate 610 to form an approximate annular shape when viewed in plan view.

The conductive layer 650 is formed inside the barrier 640. Consequently, the conductive layer 650 covers the plurality of light emitting chips 620 and the conductive wires 630 formed on the substrate 610 so as to protect these from the external environment.

As described above, the present invention is capable of increasing a surface area of the second conductive bulk 611b in the substrate 610 to which the light emitting chips 620 are attached, thus increasing radiation performance. On the other hand, the present invention can also be embodied in such a way that a surface area of the first conductive bulk 611a of the substrate 610 is relatively increased and the plurality of light emitting chips 620 are attached to the first conductive bulk 611a.

In this embodiment, the present invention is not intended to limit the planar shape of the substrate 610 to a circular shape, but may be variously varied according to a user's design, intended purpose and intended use.

Figure 7A:
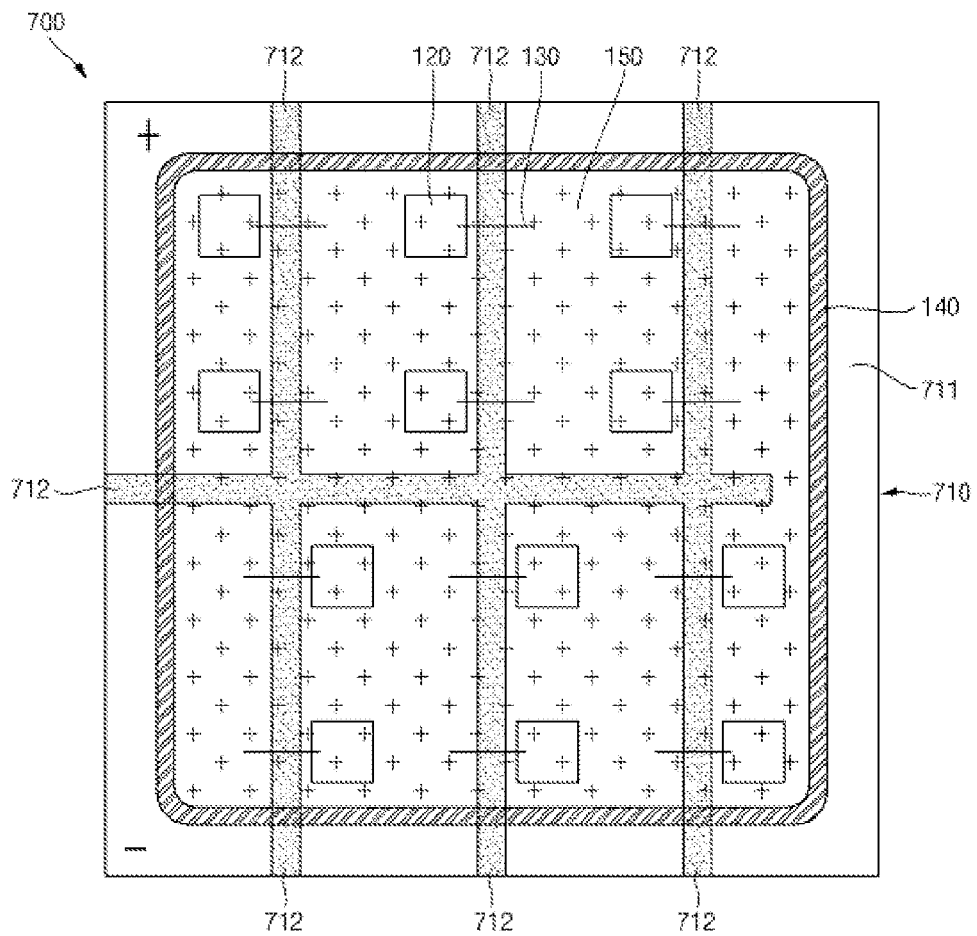
FIGS. 7a and 7b are a plan view and an equivalent circuit schematic showing an optical device according to a still further embodiment of the present invention.
Figure 7B:
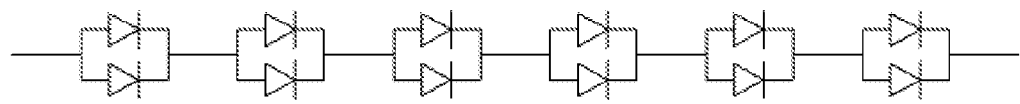

FIGS. 7a and 7b are a plan view and an equivalent circuit schematic showing an optical device according to a still further embodiment of the present invention.

As shown in FIG. 7a, the optical device 700 according to the still further embodiment of the present invention is configured such that a plurality of conductive bulks 711 constituting a substrate 710 are arranged in a lateral direction as well as in a vertical direction so as to assure various series and parallel connections. In an example, the plurality of conductive bulks 711 are arranged into four columns and two rows. It goes without saying that penetrating insulation members 712 are disposed between the conductive bulks 711 to electrically separate the conductive bulks 711 from each other. In this embodiment, since the rightmost conductive bulk 711 is not divided, the light emitting chips 120 located in the first row and the light emitting chips 120 located in the second row are electrically connected to each other via the rightmost conductive bulk 711. The leftmost of the conductive bulks 711 located in the first row may be provided on a lower surface with a terminal layer (not shown) and the leftmost of the conductive bulks 711 located in the second row may be provided on the lower surface with a terminal layer (not shown). It goes without saying that the penetrating insulation members 712 may be provided at upper and lower surfaces with the insulative fixing members described above. Only the conductive bulks 711 constituting the substrate 710 and the penetrating insulation members 712 are slightly different from those described in previous embodiments, and the remaining components are substantially identical to those described in the previous embodiments.

The conductive bulk 711 in the first column located at the first row is connected with two light emitting chips 120. The conductive bulk 711 in the second column located at the first row is connected with two light emitting chips 120. The conductive bulk 711 in the third column located at the first row is connected with two light emitting chips 120. The conductive bulk 711 in the fourth column located at the second row is connected with two light emitting chips 120. The conductive bulk 711 in the third column located at the second row is connected with two light emitting chips 120. The conductive bulk 711 in the second column located at the second row is connected with two light emitting chips 120. Each of the conductive wires 130 is connected at one end to the corresponding light emitting chips 120 and is connected at the other end to the adjacent conductive bulk 711.

Consequently, as shown in FIG. 7b, there is provided a surface emitting optical device which is configured such that two light emitting chips constituting a pair are connected to each other in parallel and six pairs of light emitting chips are connected to each other in series.

Figure 8A:
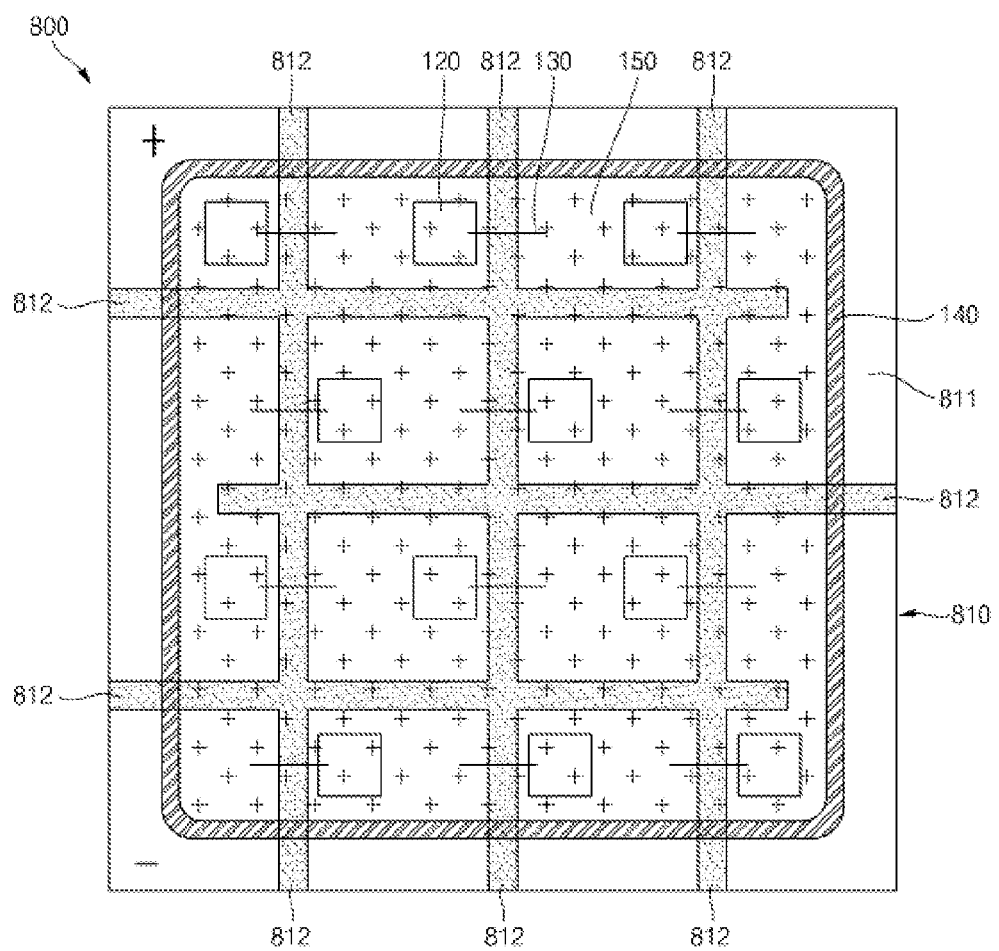
FIGS. 8a and 8b are a plan view and an equivalent circuit schematic showing an optical device according to a still further embodiment of the present invention.
Figure 8B:
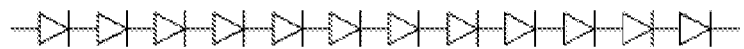

FIGS. 8a and 8b are a plan view and an equivalent circuit schematic showing an optical device according to a still further embodiment of the present invention.

As shown in FIG. 8a, the optical device 800 according to the still further embodiment of the present invention is configured such that a plurality of conductive bulks 811 constituting a substrate 810 are arranged in a lateral direction as well as in a vertical direction so as to assure various series and parallel connections. In an example, the plurality of conductive bulks 811 are arranged into four columns and four rows. It goes without saying that penetrating insulation members 812 are disposed between the conductive bulks 811 to electrically separate the conductive bulks 811 from each other. In this embodiment, since some pairs of adjacent conductive bulks 811 are not separated from each other, the first row of light emitting chips 120 and the second row of light emitting chips 120 are electrically connected to each other in series, the second row of light emitting chips 120 and the third row of light emitting chips 120 are electrically connected to each other in series, and the third row of light emitting chips 120 and the fourth row of light emitting chips 120 are electrically connected to each other in series. The leftmost one of the conductive bulks 811 located at the first row may be provided on the lower surface with a terminal layer (not shown) and the leftmost one of the conductive bulks 811 located at fourth row may be provided on the lower surface with a terminal layer (not shown).

The conductive bulk 811 in the first column located at the first row is connected with one light emitting chip 120. The conductive bulk 811 in second column located at the first row is connected with one light emitting chip 120. The conductive bulk 811 in the third column located at the first row is connected with one light emitting chip 120. The conductive bulk 811 in the fourth column located at the second row is connected with one light emitting chip 120. The conductive bulk 811 in the third column located at the second row is connected with one light emitting chip 120. The conductive bulk 811 in the second column located at the second row is connected with one light emitting chip 120. The conductive bulk 811 in the third column located at the third row is connected with one light emitting chip 120. The conductive bulk 811 in the second column located at the third row is connected with one light emitting chip 120. The conductive bulk 811 in the third column located at the third row is connected with one light emitting chip 120. The conductive bulk 811 in the fourth column located at the fourth row is connected with one light emitting chip 120. The conductive bulk 811 in the third column located at the fourth row is connected with one light emitting chip 120. The conductive bulk 811 in the second column located at the fourth row is connected with one light emitting chip 120.

Each of the conductive wires 130 is connected at one end to the corresponding light emitting chips 120 and is connected at the other end to the adjacent conductive bulk 811.

Consequently, as shown in FIG. 8b, there is provided a surface emitting optical device which is configured such that twelve light emitting chips are connected to each other in series.

Figure 9:
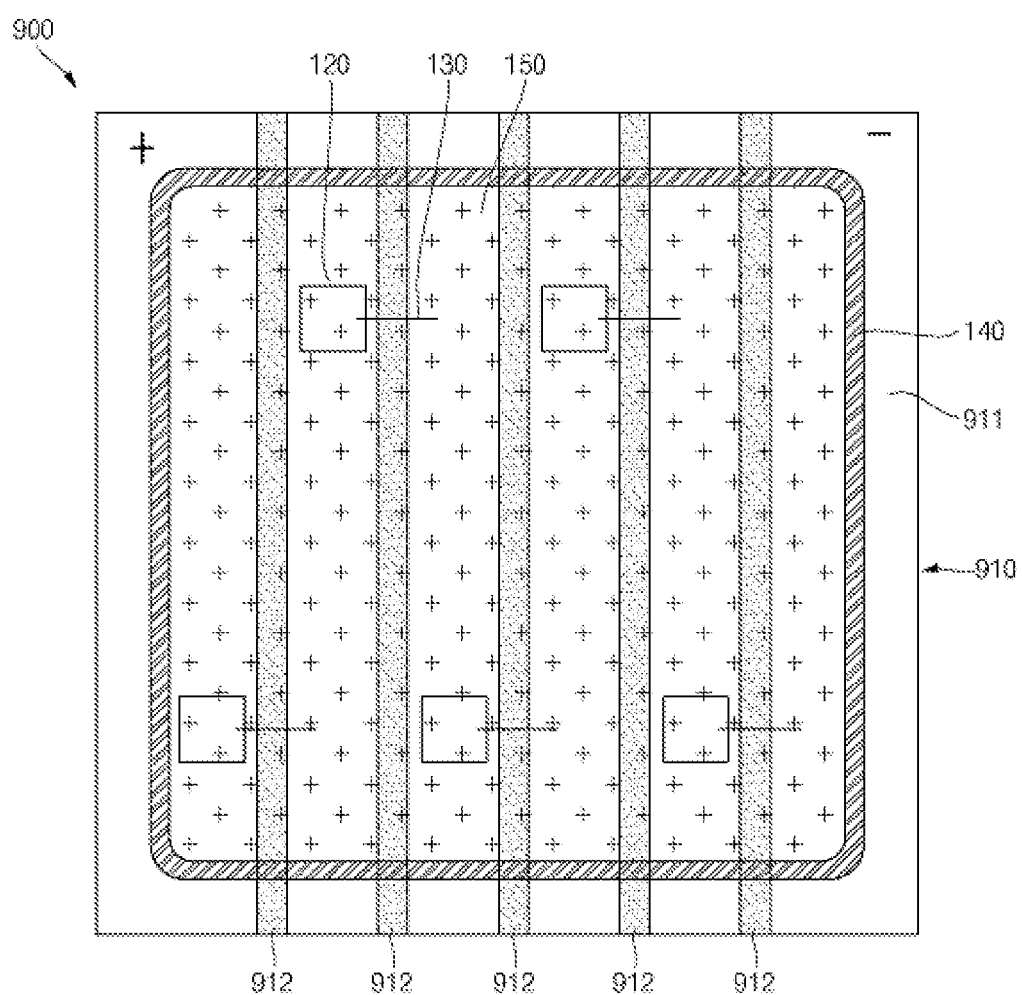
FIG. 9 is a plan view showing an optical device according to a still further embodiment of the present invention.

FIG. 9 is a plan view showing an optical device according to a still further embodiment of the present invention.

As shown in FIG. 9, the optical device 900 of the still further embodiment of the present invention is configured such that conductive bulks 911 constituting a substrate 910 may be composed of about six columns. Likewise, penetrating insulation members 912 are disposed between the conductive bulks 911. The leftmost bulk 911 located in the first column is provided on the lower surface with a terminal layer (not shown) and the rightmost bulk 911 located at the sixth column is provided on the lower surface with the other terminal layer (not shown). The light emitting chips 120 are attached in a zigzag pattern to the conductive bulks 911 constituting the substrate 910, and each of the light emitting chips 120 is connected to the adjacent conductive bulk 911 via a conductive wire 130. Consequently, there is provided a surface emitting optical device which is configured such that five light emitting chips are connected to each other in series.

Figure 10A:
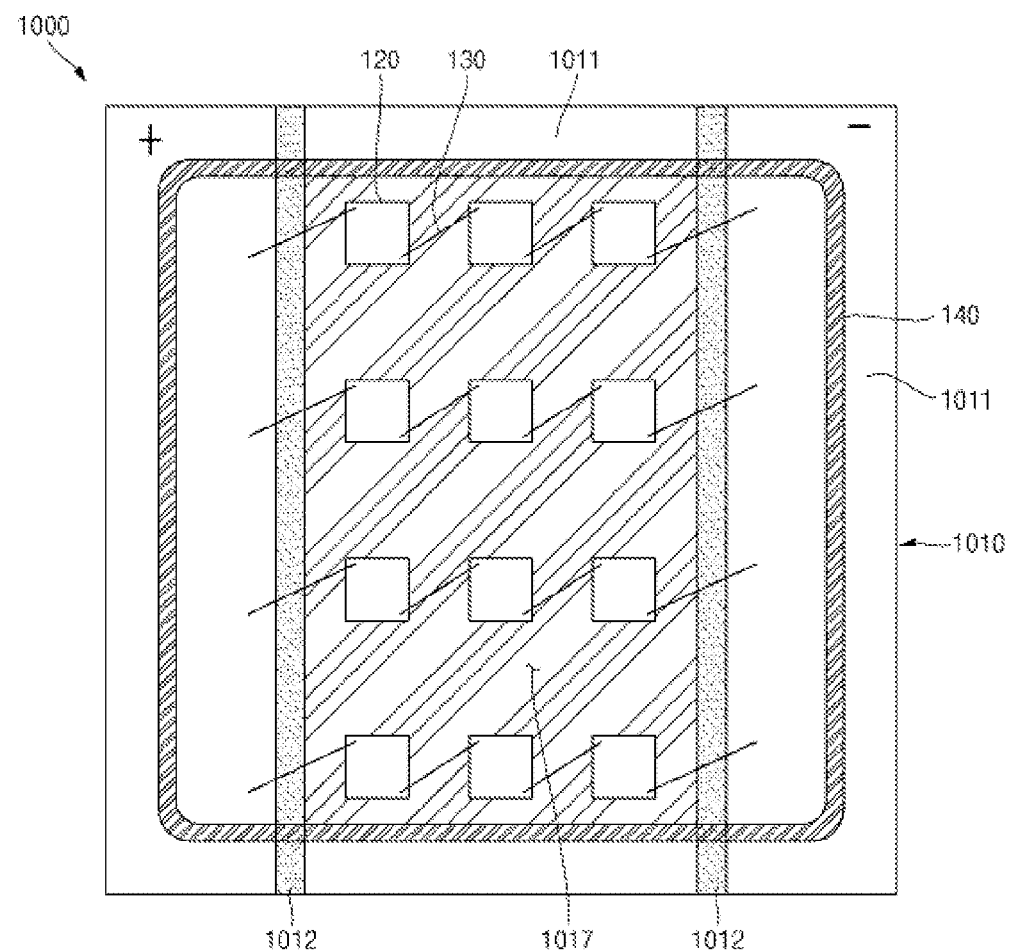
FIGS. 10a and 10b are a plan view and an equivalent circuit schematic showing an optical device according to a still further embodiment of the present invention.
Figure 10B:
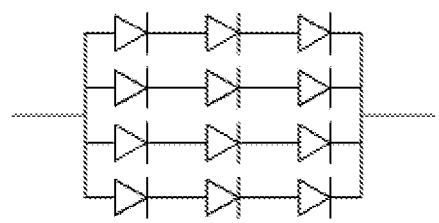

FIGS. 10a and 10b are a plan view and an equivalent circuit schematic showing an optical device according to a still further embodiment of the present invention. For the sake of convenience, protective layers which cover light emitting chips and conductive wires are not shown in the drawings.

As shown in FIG. 10a, the optical device 1000 according to the still further embodiment of the present invention is configured such that a substrate 1010 comprises a plurality of conductive bulks 1011, penetrating conductive members 1012 disposed between the plurality of conductive bulks 1011, an insulation layer 1017 formed on an upper surface of at least one of the plurality of conductive bulks 1011, and a conductive layer (not shown) formed on an upper surface of at least one of the plurality of conductive bulks 1011. Specifically, the plurality of conductive bulks 1011 are composed of three columns. Among these, the central conductive bulk 1011 is provided on an upper surface with the insulation layer 1017. Furthermore, both side conductive bulks 1011 are provided on upper surfaces thereof with the conductive layers (not shown), and are provided on lower surfaces thereof with terminal layers (not shown).

The plurality of light emitting chips 120 are adhesively attached to the insulation layer 1017. In this regard, since the plurality of light emitting chips 120 are attached to the insulation layer 1017, they are not electrically connected to the central conductive bulk 1011.

The plurality of conductive wires 130 electrically connect adjacent light emitting chips 120 to each other, or electrically connect each of the light emitting chips 120 to the adjacent conductive bulk 1011. In an example, the light emitting chips 120 located at the first row are electrically connected to each other via conductive wires 130, and the light emitting chips 120 located at left and right ends of the first row are connected to both of the left and right side conductive bulks 1011 via the conductive wires 130. Likewise, the light emitting chips 120 located in the second and third rows are connected in the same manner.

Consequently, as shown in FIG. 10b, there is provided a surface emitting optical device which is configured such that four light emitting chips located in one row are connected to each other in series and four rows of light emitting chips are connected in parallel.

Figure 11A:
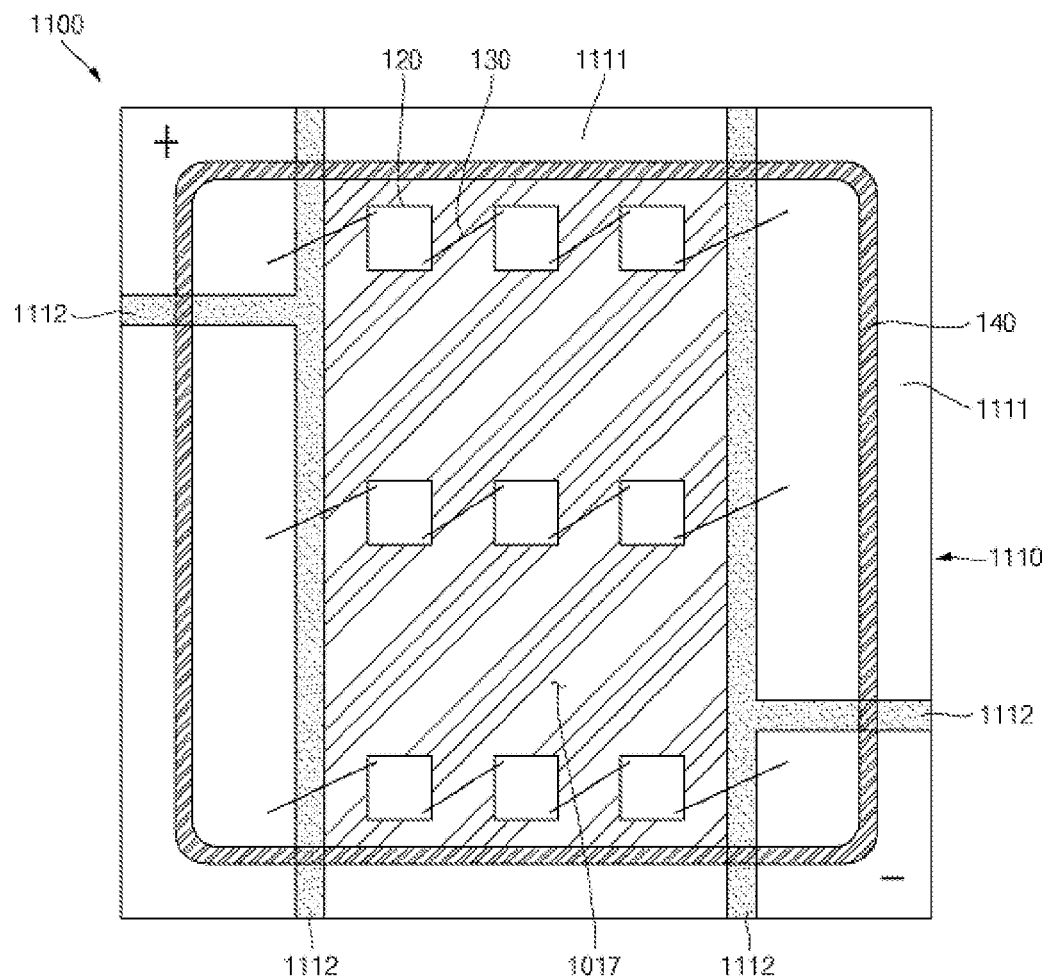
FIGS. 11a and 11b are a plan view and an equivalent circuit schematic showing an optical device according to a still further embodiment of the present invention.
Figure 11B:
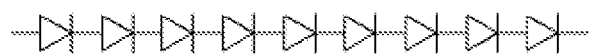

FIGS. 11a and 11b are a plan view and an equivalent circuit schematic showing an optical device according to a still further embodiment of the present invention. For the sake of convenience, protective layers which cover light emitting chips and conductive wires are not shown in the drawings.

As shown in FIG. 11a, the optical device 1100 according to the still further embodiment of the present invention is configured such that lateral penetrating insulation members 1112 are further formed in the both left and right side bulks 1111. Specifically, each of the both left and right side conductive bulks 1111 is divided into two bulks. In this regard, the left and upper conductive bulk 1111 is provided on a lower surface with a terminal layer (not shown), and the right and lower conductive bulk 1111 is provided on the lower surface with a terminal layer (not shown).

Consequently, as shown in FIG. 11b, there is provided a surface emitting optical device which is configured such that nine light emitting chips are connected to each other in series.

Figure 12A:
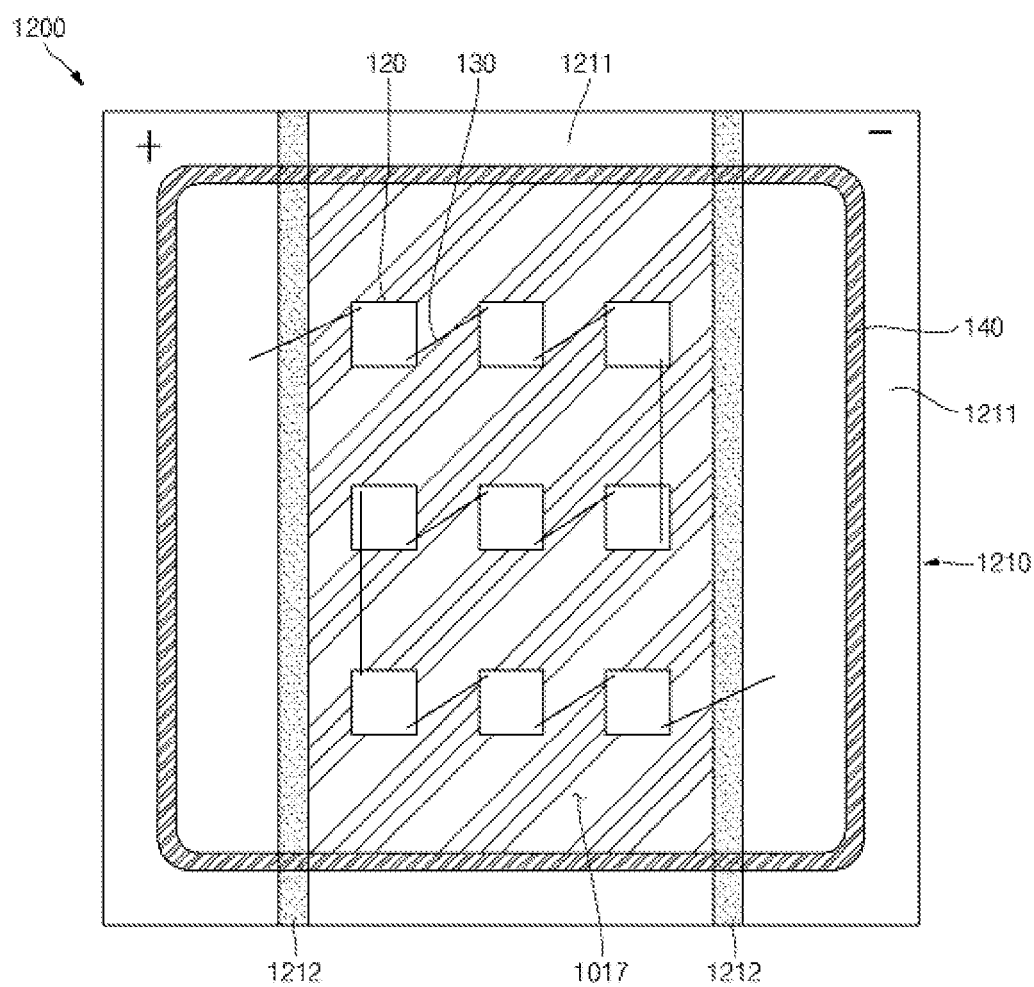
FIGS. 12a and 12b are a plan view and an equivalent circuit schematic showing an optical device according to a still further embodiment of the present invention.
Figure 12B:

FIGS. 12a and 12b are a plan view and an equivalent circuit schematic showing an optical device according to a still further embodiment of the present invention. For the sake of convenience, protective layers which cover light emitting chips and conductive wires are not shown in the drawings.

As shown in FIG. 12a, the optical device 1200 according to the still further embodiment of the present invention is configured such that all light emitting chips 120 formed on an insulation layer 1017 are connected to each other in series. The light emitting chip 120, which is located in the first row and the first column, is electrically connected to the left adjacent conductive bulk 1211 via a conductive wire 130, and the light emitting chip 120, which is located in the third row and the third column, is electrically connected to the right adjacent conductive bulk 1211.

Consequently, as shown in FIG. 12b, there is provided a surface emitting optical device which is configured such that nine light emitting chips are connected to each other in series.

Figure 13A:
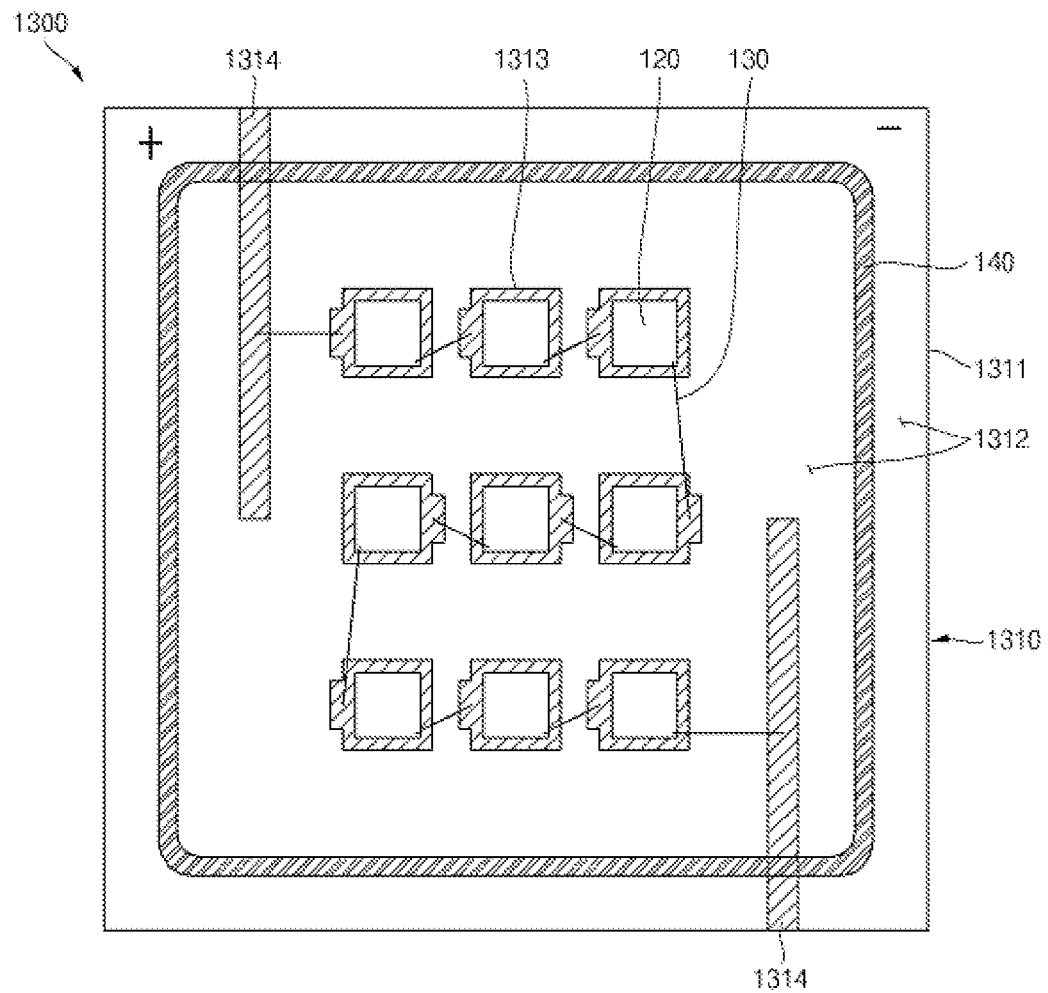
FIGS. 13a and 13b are a plan view and an equivalent circuit schematic showing an optical device according to a still further embodiment of the present invention.
Figure 13B:
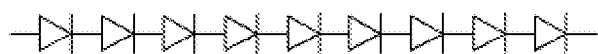

FIGS. 13a and 13b are a plan view and an equivalent circuit schematic showing an optical device according to a still further embodiment of the present invention. For the sake of convenience, protective layers which cover light emitting chips and conductive wires are not shown in the drawings.

As shown in FIGS. 13a and 13b, the optical device 1300 according to the still further embodiment of the present invention is configured such that a substrate 1310 comprises one conductive bulk 1311, an insulation layer 1312 formed over the entire upper surface of the conductive bulk 1311, a plurality of electrode layers 1313 formed on a surface of the insulation layer 1312, and a plurality of terminal layers 1314 formed on the surface of the insulation layer 1312. The plurality of electrode layers 1313 are arranged in three rows and three columns. Because the plurality of electrode layers 1313 are regions to which light emitting chips 120 and conductive wires 130 are electrically connected, they may be made of at least one selected from among gold (Au), silver (Ag), copper (Cu), aluminum (Al), nickel (Ni), tungsten (W), palladium (Pd) and equivalents, or alloys thereof. The electrode layers 1313 may be formed using a conventional spraying process, a paste process, an ink printing process and so on, and a shape and location of the electrode layers 1313 may be varied depending on the intentions of a user. Furthermore, it goes without saying that the electrode layers 1313 may be formed into various shapes such that light emitting chips 120, which will be described later, are connected to each other in series, in parallel, or in series-parallel.

The light emitting chips 120 are attached to the respective electrode layers 1313 using conductive adhesive (not shown), and the conductive wires connect the terminal layer 1314 to the electrode layer 1313, the light emitting chips 120 to the electrode layers 1313, and the light emitting layer 120 to the terminal layer 1314. In an example, the electrode layer 1313, which is located in the first row and the first column, is electrically connected to the adjacent terminal layer 1314 via the conductive wire 130. The light emitting chip 120, which is located in the third row and the third column, is electrically connected to the adjacent terminal layer 1314 via the conductive wire 130.

Consequently, as shown in FIG. 13b, there is provided a surface emitting optical device which is configured such that nine light emitting chips are connected to each other in series.

Hereinafter, a method of manufacturing an optical device according to a still further embodiment of the present invention will be described.

FIG. 4 is a flowchart illustrating the method of manufacturing an optical device according to the still further embodiment of the present invention.

Figure 14:
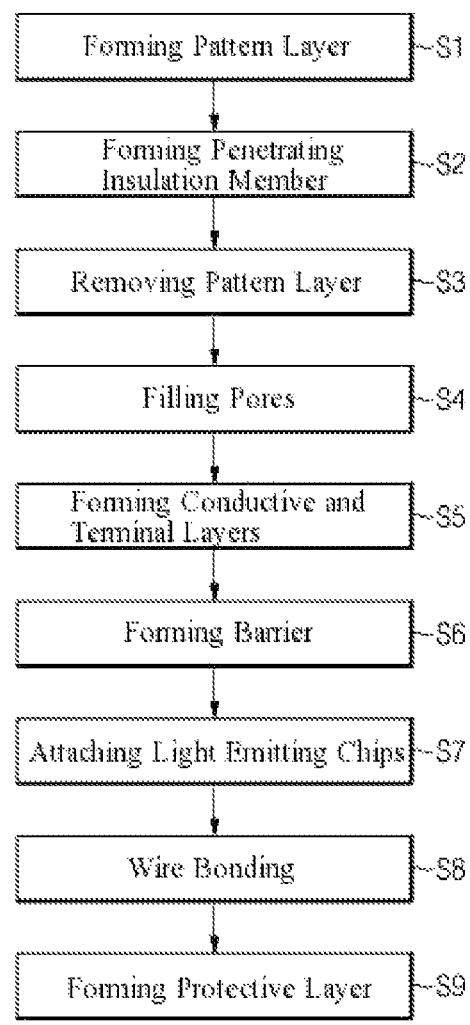
FIG. 14 is a flowchart illustrating the method of manufacturing an optical device according to the still further embodiment of the present invention.

As shown in FIG. 14, the method of manufacturing an optical device according to the still further embodiment of the present invention comprises an operation of forming pattern layers (S1), an operation of forming a penetrating insulation member (S2), an operation of removing the pattern layers (S3), an operation of filling pores (S4), an operation of forming a conductive layer and a terminal layer (S5), an operation of forming a barrier (S6), an operation of attaching light emitting chips (S7), an operation of bonding wires (S8) and an operation of forming a protective layer (S9).

Figure 15A:
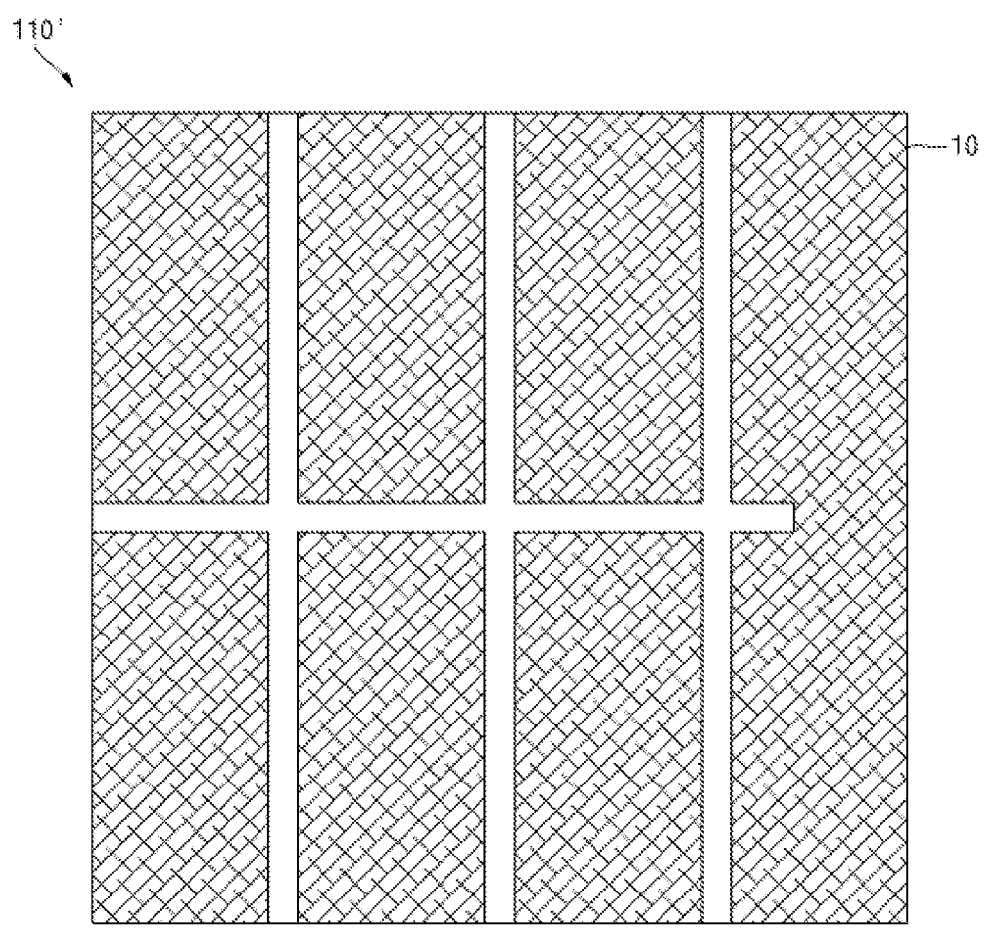
FIGS. 15a and 15h are plan views illustrating the method of manufacturing an optical device, shown in FIG. 14.
Figure 15B:
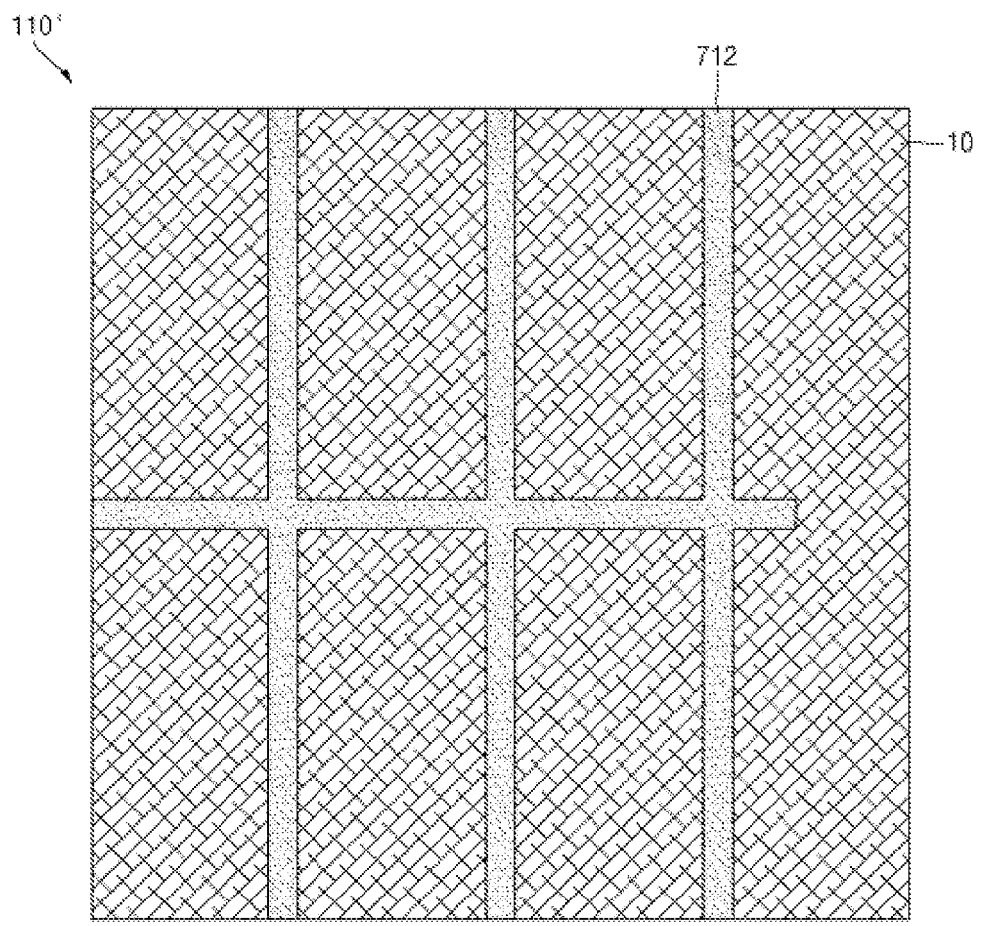
Figure 15C:
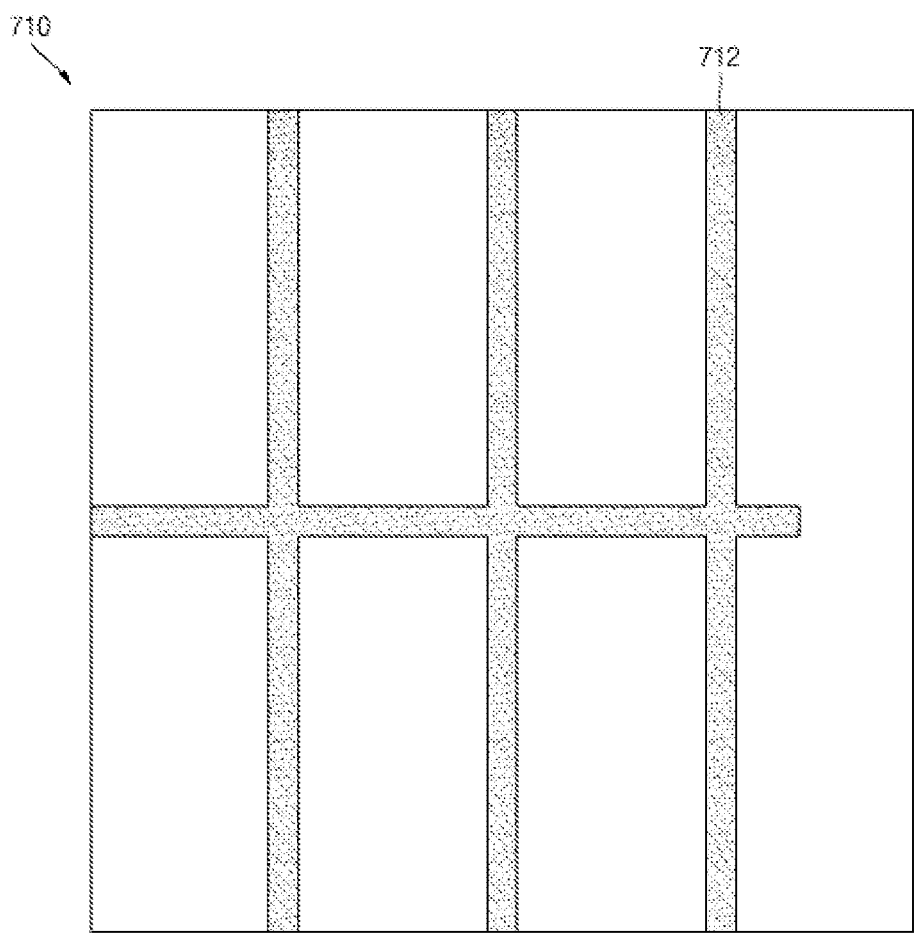
Figure 15D:
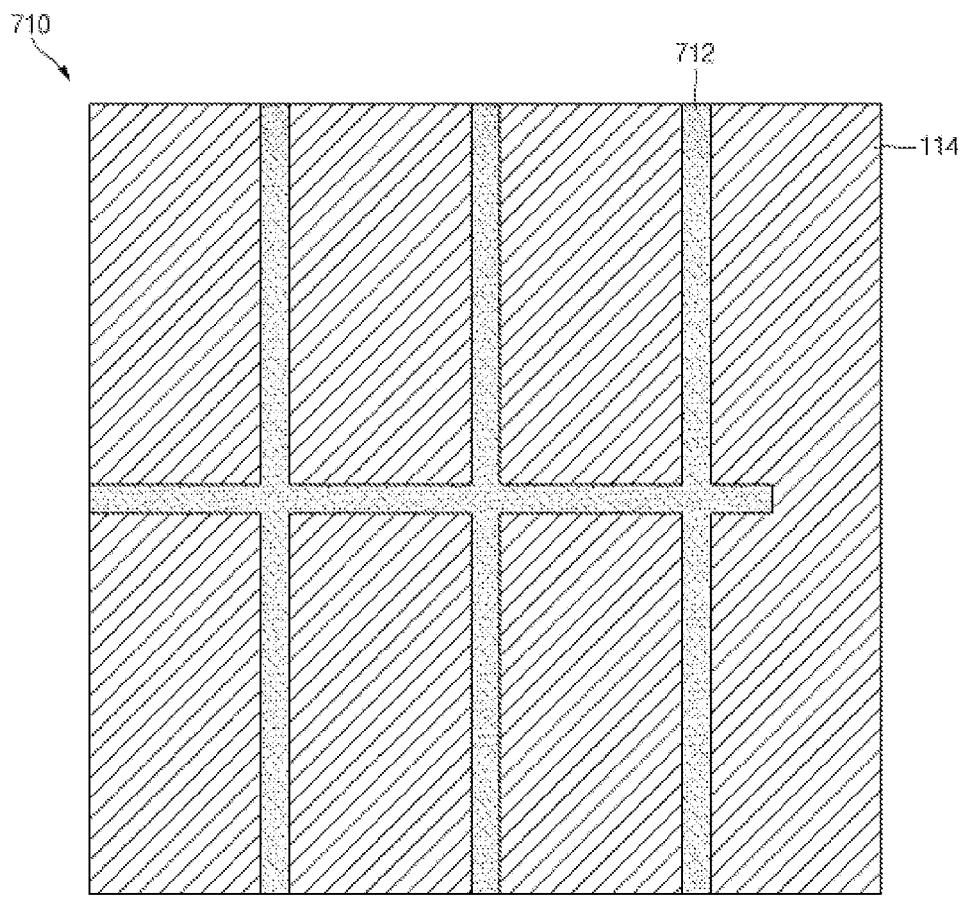
Figure 15E:
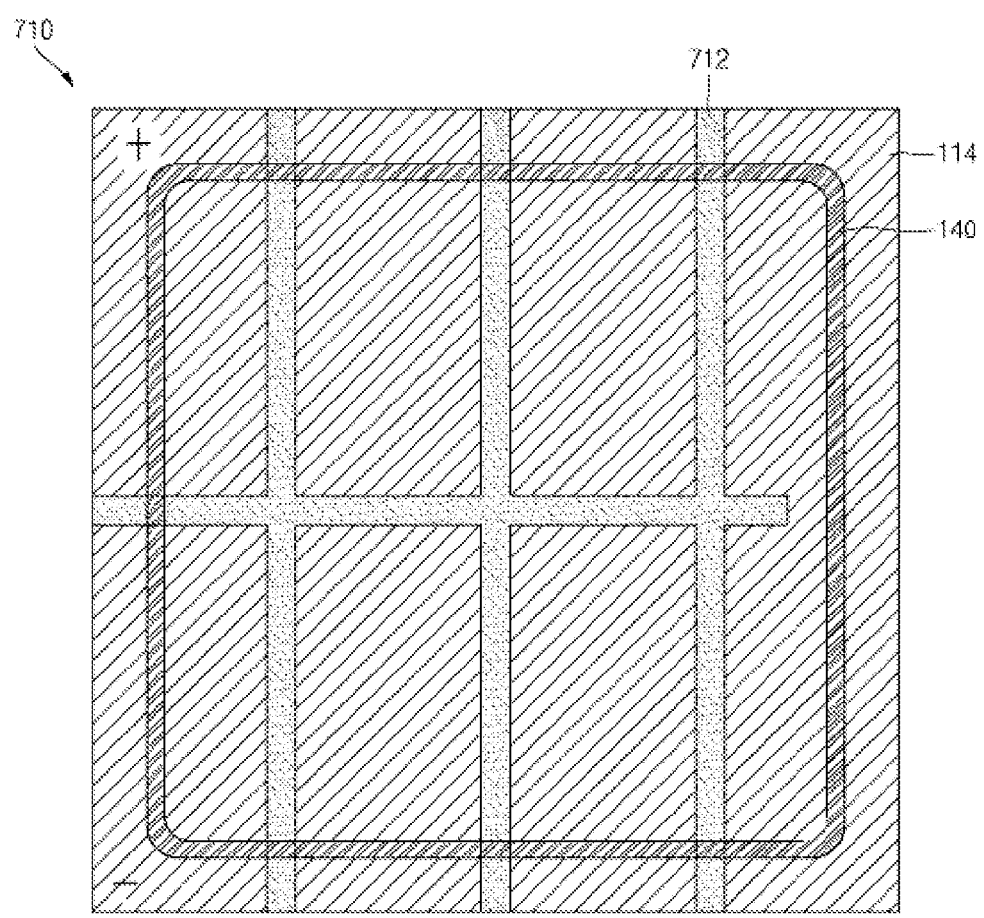
Figure 15F:
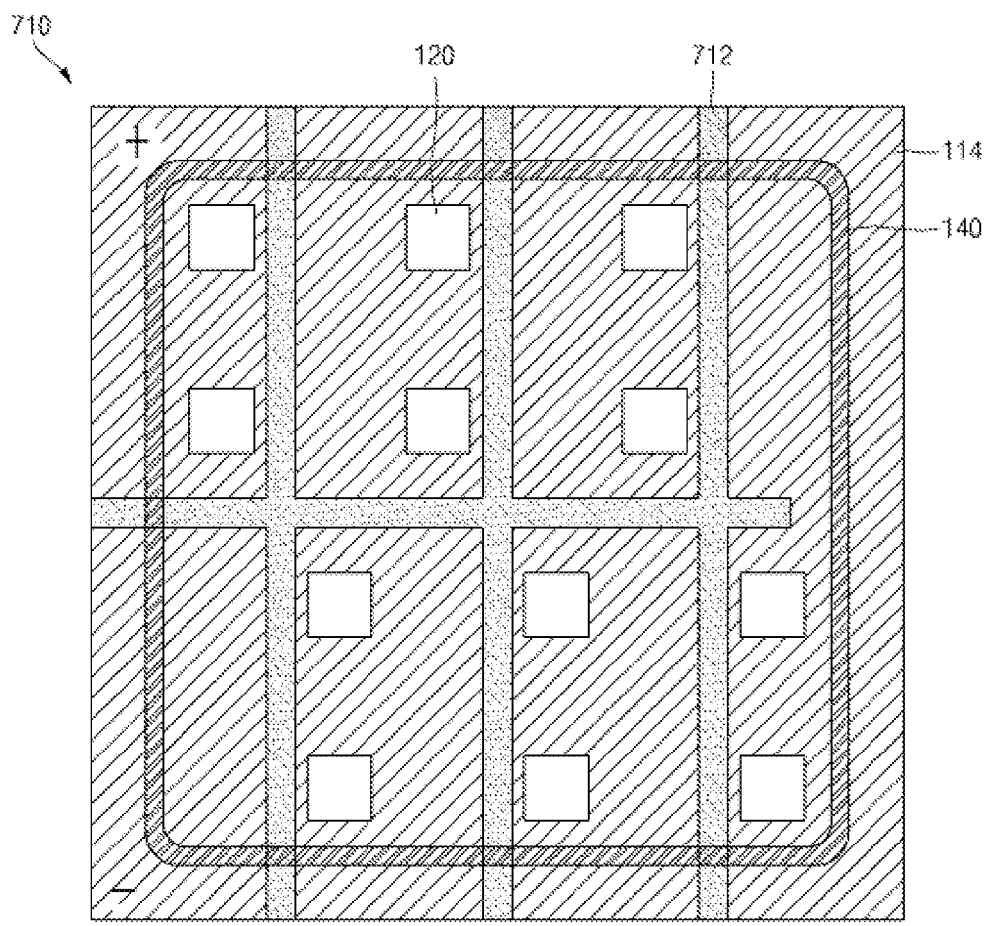
Figure 15G:
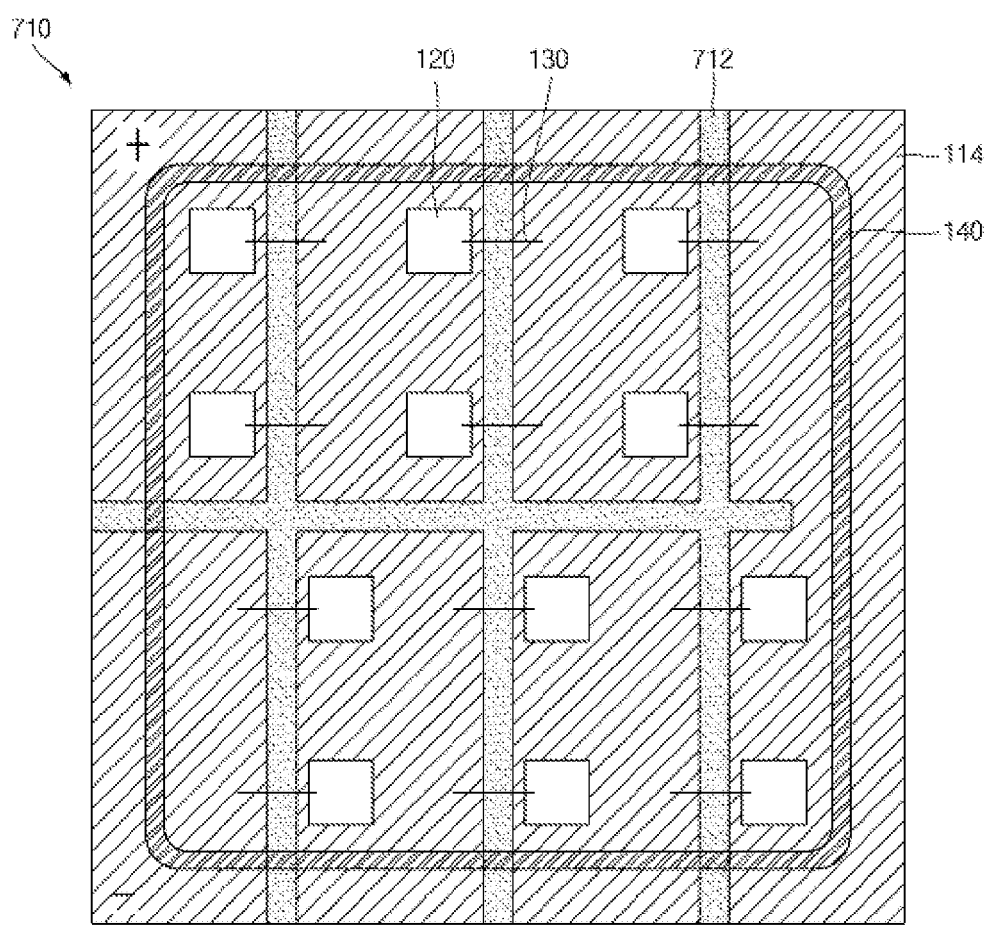
Figure 15H:
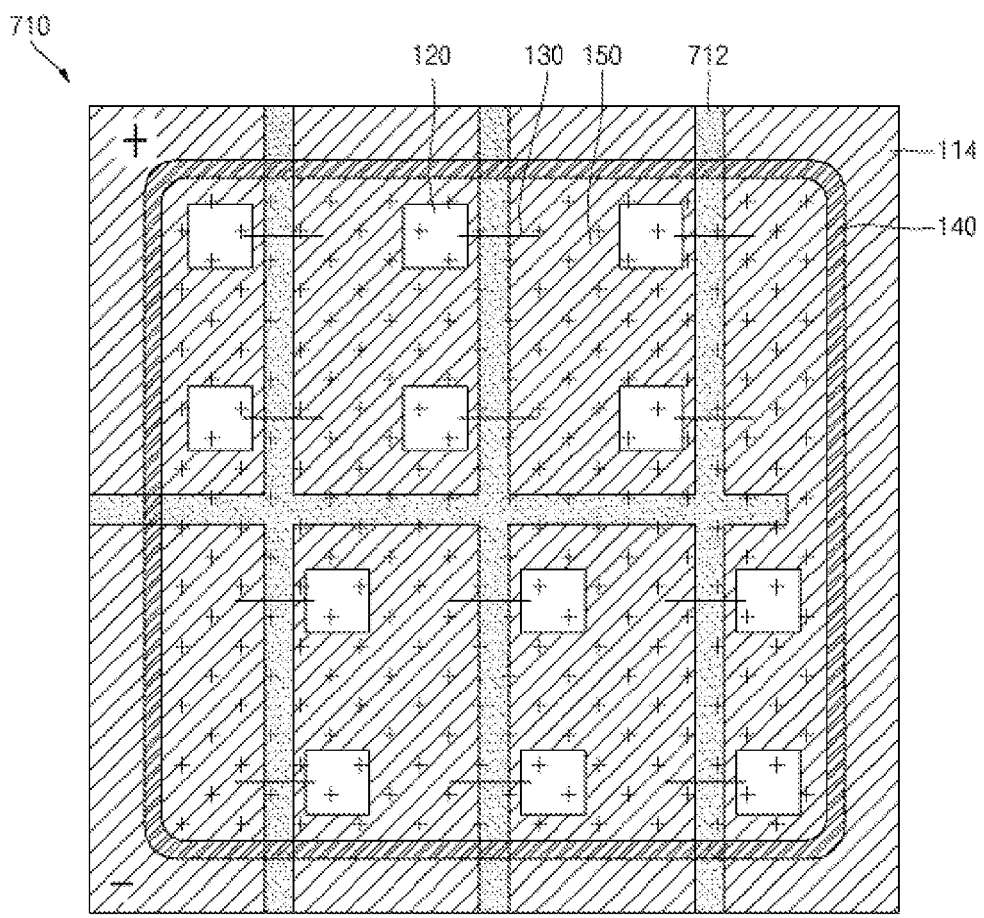

FIGS. 15a and 15h are plan views illustrating the method of manufacturing an optical device, shown in FIG. 14. The optical device, which is manufactured by the present invention, is substantially identical to that shown in FIG. 7a.

Referring to FIGS. 14 and 15a, in the operation of forming a pattern layer (S1), pattern layers 10 are formed on upper and lower surfaces of a metal plate 110'. The metal plate 110' may be made of any one selected from among aluminum, aluminum alloy, copper, copper alloy, iron, iron alloy and equivalents, but the present invention is not intended to be limited to these materials. The pattern layers 10 may be formed in such a way as to apply a mask solution and perform exposure and development or to attach films on which a pattern is formed.

Referring to FIGS. 14 and 15b, in the operation of forming a penetrating insulation member (S2), the region exposed through the pattern layers 10 is anodized to form the penetrating insulation member 712. The penetrating insulation member 712 is formed such that the penetrating insulation member 712 vertically passes through the thickness of the metal plate 110' and is disposed in a width direction. The penetrating insulation member 712 divides the metal plate 110' into a plurality of regions, and the divided regions may have the same surface area or different surface areas. Alternatively, the penetrating insulation member 712 may be configured such that it has flat lateral surfaces in a thickness direction or it has a double cone-shaped section and lateral surfaces which are concave at their center, and which results from performing anodizing treatment on upper and lower surfaces of the metal plate 110'.

Referring to FIGS. 14 and 15c, in the operation of removing the pattern layers (S3), the pattern layers 10 are removed from the substrate 710. When the pattern layers 10 are made of a mask solution, the pattern layers 10 may be removed through an ashing process. When the pattern layers 10 are made of dry films, the pattern layers 10 may be removed by separating the dry films from the substrate 710.

Referring to FIG. 14, in the operation of filling pores (S4), fine pores, which are present in the penetrating insulation member 712 formed in the operation of forming the penetrating insulation member (S3), are filled with any one selected from PCB (Benzocyclobuten), insulation organic material and distilled water or combinations thereof. The penetrating insulation member 712 is brittle and is liable to be broken by external force. Accordingly, the mechanical strength and insulation performance of the penetrating insulation member 712 may be improved by filling the pores, most of which are brittle, with the above materials.

When the pores are filled with PCB or an insulating organic material, the operation of curing the material by applying heat at a predetermined temperature may be further performed. Additionally, an insulative fixing member (not shown) may be further formed on upper and lower surfaces of the penetrating insulation member 712 so as to further improve the strength of the penetrating insulation member 712. Since the insulative fixing member covers partial regions of upper and lower surfaces of the substrate 710, warping of the substrate 710 can be prevented. The insulative fixing member may be made of any one selected from among polyphthalamide (PPA), epoxy resin, photosensitive paste, equivalents and mixtures thereof, but the present invention is not intended to limit the material of the insulative fixing member.

After the operation of filling pores (S4), an operation of polishing surfaces of the substrate 710 to remove burrs or scratches generated on the surfaces of the substrate 710 may also be carried out.

With the polishing operation, the light which is emitted from a light emitting chip which will be bonded to a region of the substrate 710 is efficiently reflected, thus improving light efficiency. The polishing operation may be usually performed using a buffing process.

Referring to FIGS. 14 and 15d, in the operation of forming a conductive layer and a terminal layer (S5), the conductive layer 114 is formed on an upper surface of the substrate 710, and the terminal layer is formed on a lower surface (not shown) of the substrate 710. Each of the conductive layer 114 and the terminal layer may be embodied into a single layer or a double layer. The conductive layer 114 may be made of one selected from among gold, silver, copper, aluminum, nickel, tungsten, palladium and combinations thereof, which are excellent in electric conductivity and electric contact. The conductive layer 114 is formed over the entire upper surface of the substrate 710. The terminal layer may be made of copper or nickel/gold which has excellent electric conductivity. The terminal layer is formed on a lower surface of a region of the substrate 710 located at the first row and the first column, and on a lower surface of a region of the substrate 710 located at the second row and the first column.

The operation of forming the conductive layer 114 and the terminal layer may be performed using any one selected from among an electroless plating process, an electrolytic plating process, a paste process, a spray process (a plasma arc spraying process or a cold spraying process), an ink printing process and combinations thereof.

In an example, when the conductive wire 130, which will be connected later, is made of gold (Au), the conductive layer 114 may be made of silver (Ag) which has excellent electric conductivity and is capable of efficiently reflecting light emitted from a light emitting chip. Furthermore, when the conductive wires 130 are made of aluminum (Al), the bonding force holding the conductive wires 130 to the substrate 710 may be excellent even though the conductive layer 114 is not used.

In particular, when an electroless plating process or an electrolytic plating process is used, an additional masking treatment may be performed in such a way that the conductive layer 114 and the terminal layer are formed only on a predetermined region of the substrate 710.

When the spraying process is used, the conductive layer 114 and the terminal layer may be selectively formed on a predetermined region of the substrate 710 using an additional mask.

Referring to FIGS. 14 and 15e, in the operation of forming a barrier (S6), the barrier 140 is formed on the conductive layer 114. The barrier 140 is formed such that it protrudes vertically from an upper surface of the conductive layer 114. The barrier 140 may be formed using a screen printing process or a mold process, and may be made of polyphthalamide (PPA), epoxy resin, photosensitive rib barrier paste (PSR) or mixtures thereof, or silicone.

Referring to FIGS. 14 and 15f, in the operation of attaching light emitting chips (S7), a plurality of light emitting chips 120 are attached to an upper surface of the substrate 710 in a row and column pattern, that is, in a matrix pattern. As mentioned above, the light emitting chips 120 may be a light emitting diode (LED). The light emitting chips 120 are attached to many regions of the substrate 710 via conductive adhesives (not shown) applied to lower surfaces of the light emitting chips (120).

Referring to FIGS. 14 and 15g, in the operation of bonding wires (S8), the light emitting chips 120 are connected to the conductive layer 114 by means of conductive wires 130. As a result of bonding of the conductive wires 130, the light emitting chips 120 are connected to each other in series, in parallel or in series-parallel. An external signal, which is transmitted to the conductive layer 114, is transmitted to the light emitting chip 120 through the conductive wire 130 so as to control light emission from the light emitting chip 120.

Referring to FIGS. 14 and 15h, in the operation of forming a protective layer (S9), fluorescent material is applied to the region defined by the barrier 140 to form the conductive layer 150.

The protective layer 150 is formed on an upper surface of the substrate 710 such that it covers the light emitting chips 120 and the conductive wires 130. The protective layer 150 functions to protect the light emitting chips 120 from external physical, mechanical, electrical and chemical impact. Additionally, the protective layer 150 can convert light generated from the light emitting chips 120 into white light.

Hereinafter, a method of manufacturing an optical device according to a still further embodiment of the present invention will be described.

Figure 16:
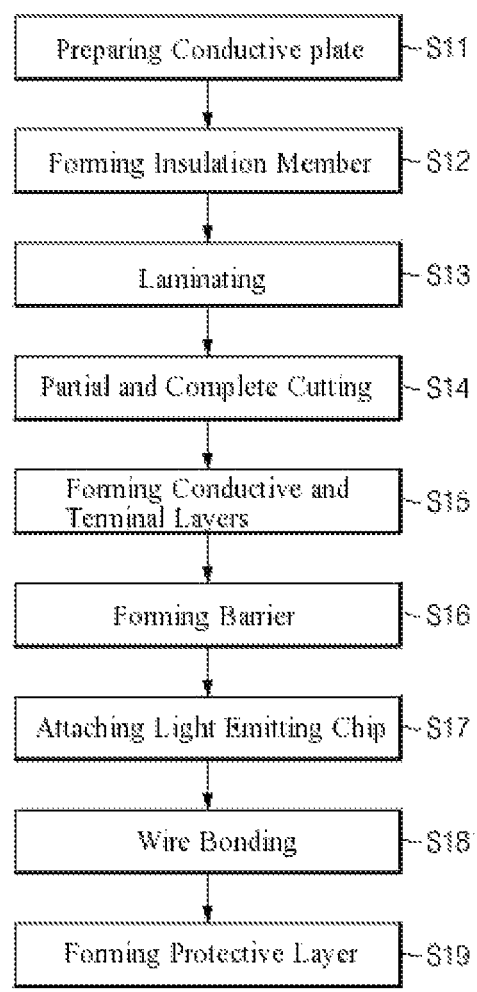
FIG. 16 is a flowchart illustrating the method of manufacturing an optical device according to the still further embodiment of the present invention.

FIG. 16 is a flowchart illustrating the method of manufacturing an optical device according to the still further embodiment of the present invention.

Referring to FIG. 16, the method of manufacturing an optical device according to the still further embodiment of the present invention comprises an operation of preparing metal plates (S11), an operation of preparing adhesive insulation members (S12), an operation of laminating (S13), an operation of partial cutting and complete cutting (S14), an operation of forming a conductive layer and a terminal layer (S15), an operation of forming a barrier (S16), an operation of attaching light emitting chips (S17), an operation of bonding wires (S18) and an operation of forming a protective layer (S19).

FIGS. 17a to 17f are perspective views showing part of the method of manufacturing an optical device, shown in FIG. 16. The method will now be described with reference to FIG. 16. The optical device manufactured by this method is substantially identical to that shown in FIG. 7a.

Figure 17A:
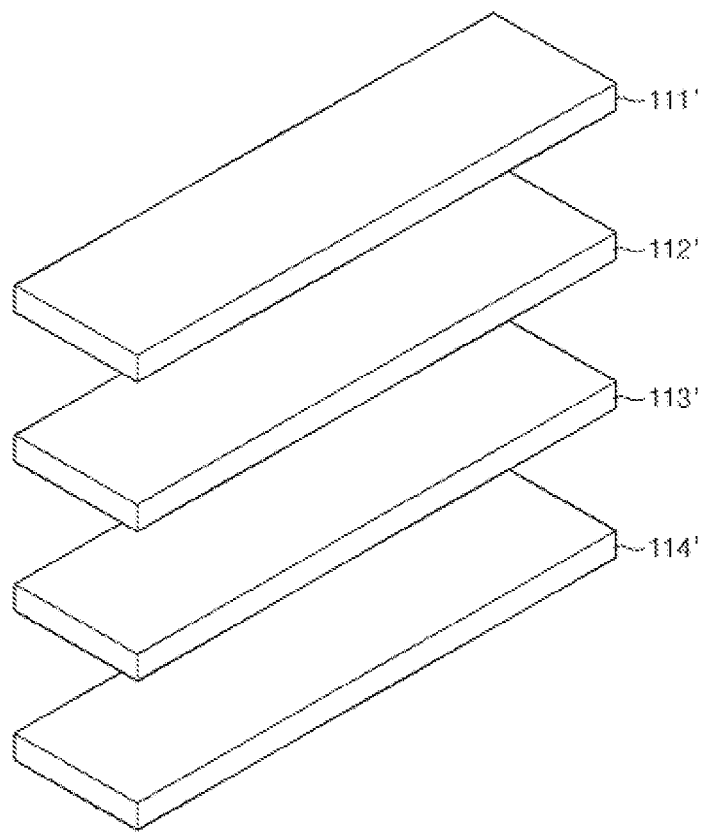
FIGS. 17a to 17f are perspective views showing part of the method of manufacturing an optical device, shown in FIG. 16. The method will now be described with reference to FIG. 16.

Referring to FIGS. 16 and 17a, in the operation of preparing metal plates (S11), four metal plates 111', 112' 113', 114' are provided. In this embodiment, although the metal plates 111', 112' 113', 114' are illustrated as being limited to the number of four, the number of the metal plates is not limited to the number of four and the metal plates may be provided in a number corresponding to the desired region of a substrate. The metal plates 111', 112' 113', 114' may be made of any one selected from among aluminum, aluminum alloy, copper, copper alloy, iron and iron alloy. Surfaces of the metal plates 111', 112' 113', 114' may be anodized so as to increase an adhesion force to adhesive insulation members in a later operation and to increase insulation properties between the metal plates 111', 112' 113', 114' and voltage resistance. Furthermore, the metal plates 111', 112' 113', 114' may be provided at boundary surfaces therebetween with roughness by being subjected to sandblasting, chemical etching, grinding or polishing process, so as to increase adhesion force to the adhesive insulation members. The metal plates 111', 112', 113', 114' are vertically stacked, thus defining subsequent regions of substrates.

Figure 17B:
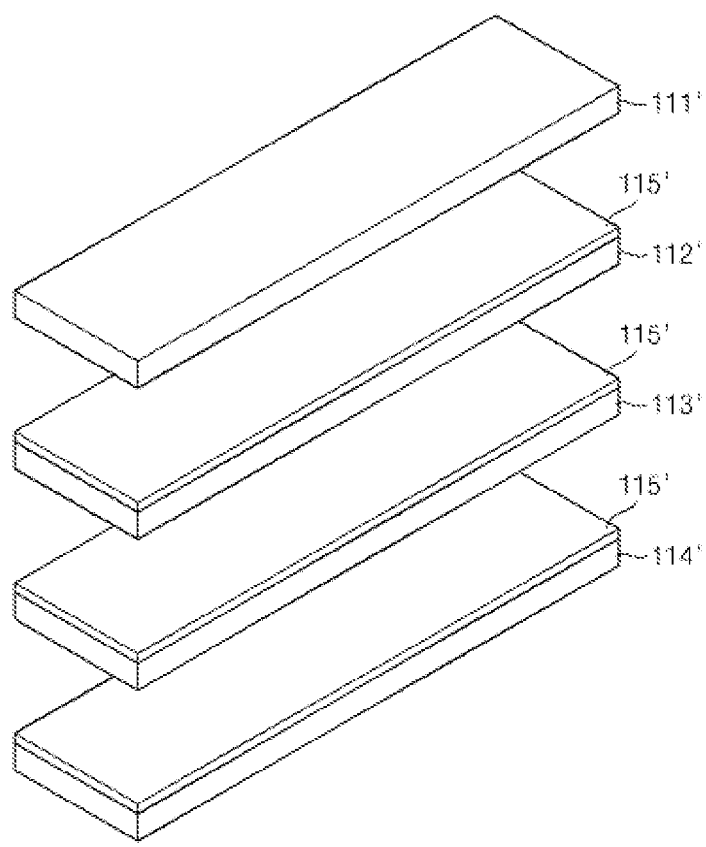

Referring to FIGS. 16 and 17b, in the operation of preparing adhesive insulation members (S12), the adhesive insulation members 115' are provided on boundary surfaces between the metal plates 111', 112', 113', 114'.

The adhesive insulation members 115' function to bond the metal plates 111', 112', 113', 114' to each other while electrically isolating the metal plates 111', 112', 113', 114' from each other. The adhesive insulation members 115' may be composed of liquid adhesive or sheet films.

The adhesive insulation members 115' will constitute a penetrating insulation member 712 of the substrate 710.

Figure 17C:
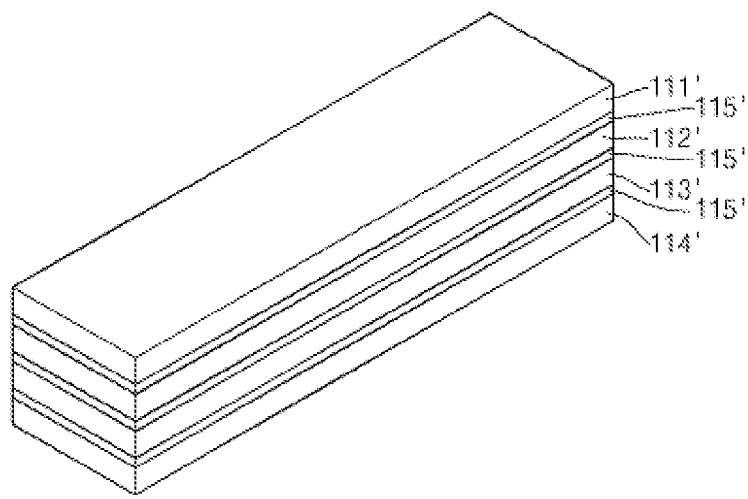

Referring to FIGS. 16 and 17c, in the operation of laminating (S13), the metal plates 111', 112', 113', 114' are laminated with the adhesive insulation members 115' disposed therebetween. Consequently, the adhesive insulation members 115' are provided between the metal plates 111', 112', 113', 114', thus providing adhesion force and electric insulation therebetween.

Figure 17D:
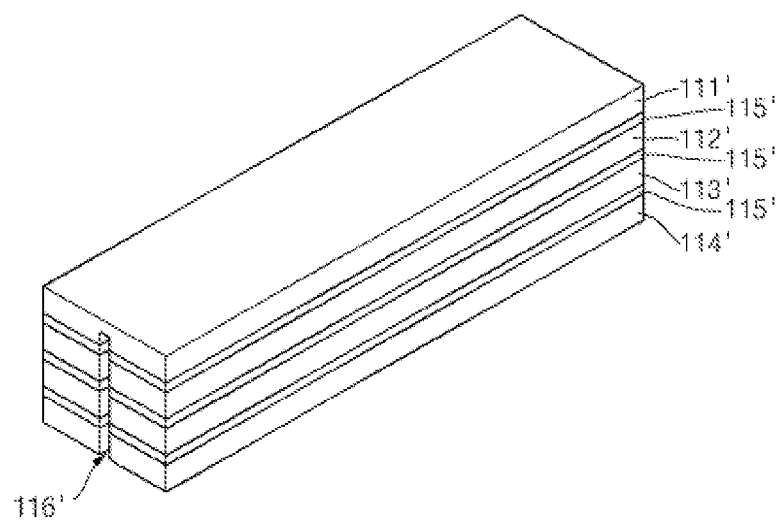
Figure 17E:
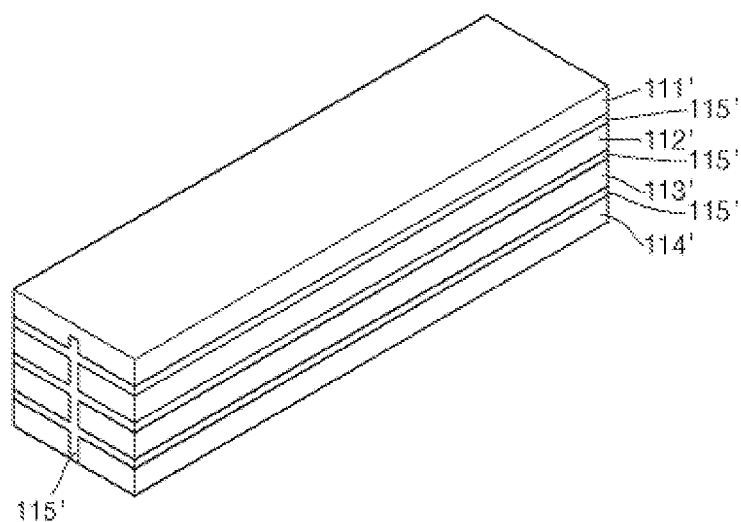
Figure 17F:
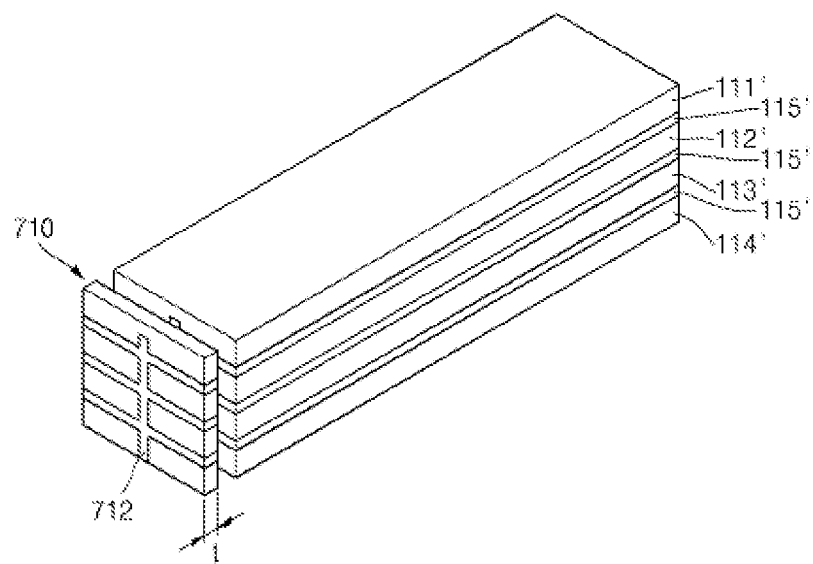

Referring to FIGS. 16 and 17d to 17f, in the operation of partial cutting and complete cutting (S14), a laminate composed of the metal plates 111', 112', 113',114' with the adhesive insulation members 115' disposed therebetween is partially cut along the length to form a slit 116'; the slit 116', which is formed by the partial cutting, is filled with an adhesive insulation member 115'; and then the laminate composed of the metal plates 111', 112', 113',114' is completely cut in a thickness direction. In other words, as shown in FIG. 17d, the laminate composed of the metal plates 111', 112', 113', 114' is partially cut along its length, thus forming the slit 116' to a predetermined depth. Subsequently, as shown in FIG. 17e, the slit 116' is filled with the adhesive insulation member 115'. Thereafter, as shown in FIG. 17f, the laminate composed of the metal plates 111', 112', 113', 114' is completely cut in a thickness, thus separating one finished substrate 710 from the laminate.

As a result, the finished substrate 710 is configured such that a plurality of regions are arranged in plural rows and plural columns. More specifically, the substrate 710 contains a plurality of regions arranged in a matrix pattern, and the respective regions are electrically isolated from each other. Furthermore, the plurality of regions have the same surface area or different surface areas. When the laminate is completely cut, a horizontal interval (t) will define a thickness of the finished substrate 710 in a vertical direction. Likewise, the plurality of regions have the same surface area or different surface areas. After the operations of partially cutting and completely cutting (S14), burrs and scratches are eliminated, and a polishing process may be performed to efficiently reflect the light emitted from the light emitting chip.

Subsequently, the operation of forming a conductive layer and a terminal layer (S15), the operation of forming a barrier (S16), the operation of attaching light emitting chips (S17), the operation of bonding wires (S18) and the operation of forming a protective layer (S19) may be further performed, thus providing the finished optical device according to the still further embodiment of the present invention. In this embodiment, the operation of forming a conductive layer and a terminal layer (S15), the operation of forming a barrier (S16), the operation of attaching light emitting chips (S17), the operation of bonding wires (S18) and the operation of forming a protective layer (S19) are substantially identical to those of the previous embodiment. Accordingly, detailed descriptions thereof will be omitted.

The above descriptions have been disclosed to illustrate exemplary embodiments for implementing an optical device according to the present invention. The present invention is not intended to be limited to the above embodiments, and those skilled in the art will appreciate that various modifications, additions and substitutions are possible, without departing from the scope and spirit of the invention as disclosed in the accompanying claims.

INDUSTRIAL APPLICABILITY

The optical device and method of manufacturing the optical device according to the present invention uses aluminum or aluminum alloy as a substrate, thus allowing heat generated from a light emitting chip to be rapidly dissipated outside through the substrate.

Furthermore, since the optical device and method of manufacturing the optical device according to the present invention use aluminum or aluminum alloy serving as wiring layers, there is no need to form additional complicated wiring layers.

In addition, since the optical device and method of manufacturing the optical device according to the present invention separates a substrate using a plurality of insulation layers, a plurality of light emitting chips can be connected to each other in series, in parallel or in series-parallel, thus realizing a surface emitter without difficulty.

The invention claimed is:

1. An optical device comprising:
a substrate;
a plurality of light emitting chips disposed on the substrate;
a plurality of conductive wires which electrically connect the substrate with the light emitting chips such that the plurality of light emitting chips are connected to each other in parallel or in series-parallel; and
a protective layer which covers the plurality of light emitting chips and the plurality of conductive wires on the substrate,
wherein the substrate comprises:
a plurality of conductive bulks which are arranged in at least one column direction;
a penetrating insulation member disposed between the plurality of conductive bulks, wherein the penetrating insulation member further includes insulative fixing members disposed on the top and the bottom thereof and covering the plurality of conductive bulks; and at least one conductive layer formed on upper surfaces of the plurality of conductive bulks.

2. The optical device according to claim 1, wherein the plurality of light emitting chips are attached to the at least one conductive layer by means of a conductive adhesive and connected to another adjacent conductive layer by means of the conductive wires.

3. The optical device according to claim 1, wherein the conductive layer is formed on upper surfaces of the plurality of conductive bulks by means of any one selected from among an electroless plating process, an electrolytic plating process, a paste process and an ink printing process.

4. The optical device according to claim 1, further comprising terminal layers formed on upper, lower or lateral surfaces of at least one of the plurality of conductive bulks.

5. The optical device according to claim 1, further comprising an insulation layer or a radiation plate disposed on a lower surface of at least one of the plurality of conductive bulks.

6. The optical device according to claim 1, wherein the plurality of conductive bulks include a plurality of protrusions formed on upper surfaces thereof.

7. The optical device according to claim 1, wherein the number of the conductive bulks in a row direction and the number of the conductive bulks in a column direction are the same or different from each other.

8. The optical device according to claim 1, wherein the plurality of light emitting chips are arranged in at least one row direction and at least one column direction, and the number of the light emitting chips in a row direction and the number of the light emitting chips in a column direction are the same as or different from each other.

9. The optical device according to claim 1, further comprising a barrier formed on the substrate such that the barrier surrounds the protective layer.

10. The optical device according to claim 9, wherein the barrier has a rectangular or circular shape when viewed in a plan.

11. The optical device according to claim 1, wherein the protective layer has a convex lens shape which is convex when viewed in cross-section.

12. The optical device according to claim 1, wherein the plurality of light emitting chips are separately covered with the protective layer, and the protective layer separately covering the light emitting chips is covered with a dome-shaped lens composed of an encapsulant.

13. The optical device according to claim 1, wherein the penetrating insulation member comprises
a plurality of penetrating insulation members disposed between the plurality of conductive bulks;
and wherein the substrate further comprises an insulation layer formed on an upper surface of at least one of the plurality of conductive bulks.

14. The optical device according to claim 13, wherein the plurality of light emitting chips are attached to the insulation layer, and wherein the light emitting chips are connected to each other by means of the conductive wires and the light emitting chips and the conductive layer are connected to each other by means of the conductive wires.

15. The optical device according to claim 1, wherein the substrate comprises:
an insulation layer formed on an upper surface of at least one of the conductive bulks;
a plurality of electrode layers formed on a surface of the insulation layer; and
a plurality of terminal layers formed on a surface of the insulation layer.

16. The optical device according to claim 15, wherein the plurality of light emitting chips are attached to the electrode layers by means of a conductive adhesive, and the plurality of conductive wires connect the light emitting chips to the electrode layers, the light emitting chips to the terminal layers, and the electrode layers to the light emitting chips.

17. The optical device according to claim 15, wherein the electrode layers are formed on upper surfaces of the insulation layer by means of any one selected from among an electroless plating process, an electrolytic plating process, a paste process and an ink printing process.

18. An optical device comprising:
a substrate including
a plurality of conductive bulks which are arranged in at least one row direction and at least one column direction,
a penetrating insulation member disposed between the plurality of conductive bulks, wherein the penetrating insulation member further includes insulative fixing members disposed on the top and the bottom thereof and covering the plurality of conductive bulks, and
at least one conductive layer formed on upper surfaces of the plurality of conductive bulks;
a plurality of light emitting chips disposed on the substrate;
a plurality of conductive wires which electrically connect the substrate with the light emitting chips such that the plurality of light emitting chips are connected to each other in series, in parallel or in series-parallel; and
a protective layer which covers the plurality of light emitting chips and the plurality of conductive wires on the substrate.

19. The optical device according to claim 18, wherein the plurality of light emitting chips are attached to the at least one conductive layer by means of a conductive adhesive and connected to another adjacent conductive layer by means of the conductive wires.

20. The optical device according to claim 18, further comprising terminal layers formed on upper, lower or lateral surfaces of at least one of the plurality of conductive bulks.

21. The optical device according to claim 18, further comprising an insulation layer or a radiation plate disposed on a lower surface of at least one of the plurality of conductive bulks.

22. The optical device according to claim 18, wherein the plurality of conductive bulks include a plurality of protrusions formed on upper surfaces thereof.

23. The optical device according to claim 18, further comprising a barrier formed on the substrate such that the barrier surrounds the protective layer.

* * * * *